United States Patent
Kang et al.

(10) Patent No.: US 9,153,464 B2
(45) Date of Patent: Oct. 6, 2015

(54) SUBSTRATE PROCESSING APPARATUS AND SUBSTRATE PROCESSING METHOD

(75) Inventors: Byung Chul Kang, Cheonan-si (KR); Byung Man Kang, Cheonan-si (KR); Donghyuk Jang, Cheonan-si (KR); Seong-soo Kim, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 433 days.

(21) Appl. No.: 13/483,703

(22) Filed: May 30, 2012

(65) Prior Publication Data

US 2012/0305024 A1    Dec. 6, 2012

(30) Foreign Application Priority Data

May 31, 2011 (KR) .................. 10-2011-0052381
Sep. 1, 2011 (KR) .................. 10-2011-0088465

(51) Int. Cl.
*H01L 21/67* (2006.01)
*H01L 21/677* (2006.01)

(52) U.S. Cl.
CPC .... *H01L 21/67109* (2013.01); *H01L 21/67173* (2013.01); *H01L 21/67178* (2013.01); *H01L 21/67742* (2013.01); *H01L 21/67769* (2013.01)

(58) Field of Classification Search
None
See application file for complete search history.

(56) References Cited

U.S. PATENT DOCUMENTS

| 7,731,799 B2 | 6/2010 | Toshima et al. |
| 8,443,513 B2 | 5/2013 | Ishida et al. |
| 2006/0207971 A1* | 9/2006 | Moriya et al. ................ 216/67 |
| 2009/0101180 A1* | 4/2009 | Jang et al. ................ 134/61 |
| 2009/0252578 A1* | 10/2009 | Machida ................ 414/222.01 |
| 2010/0018548 A1* | 1/2010 | Yi et al. ................ 134/1 |
| 2010/0314380 A1* | 12/2010 | Go et al. ................ 219/443.1 |
| 2011/0230047 A1* | 9/2011 | Marrs ................ 438/688 |

FOREIGN PATENT DOCUMENTS

| CN | 1424745 A | 6/2003 |
| CN | 101045231 A | 10/2007 |
| CN | 101089734 A | 12/2007 |
| CN | 101599423 A | 12/2009 |
| JP | H01-067705 A | 3/1989 |
| JP | 2001-316878 A | 11/2001 |
| JP | 2002-222788 A | 8/2002 |
| JP | 2004327674 A * | 11/2004 |
| JP | 2006-187680 A | 7/2006 |
| JP | 2007-216158 | 8/2007 |

(Continued)

OTHER PUBLICATIONS

English Machine Translation of JP 2004-327674 A.*

*Primary Examiner* — Nicole Blan
(74) *Attorney, Agent, or Firm* — Harness, Dickey & Pierce, P.L.C.

(57) ABSTRACT

Provided is a substrate processing apparatus. The substrate processing apparatus includes an index part including a port on which a container containing a substrate is placed and an index robot, a processing part for processing the substrate, and a buffer unit disposed between the processing part and the index part to allow the substrate transferred between the processing part and the index part to be temporarily stayed therein. The processing part includes a glue removal processing module, a substrate cooling processing module, a heat processing module, and a functional water processing module which are disposed along a transfer passage for transferring the substrate.

15 Claims, 30 Drawing Sheets

(56) References Cited

FOREIGN PATENT DOCUMENTS

| | | |
|---|---|---|
| JP | 2007-300129 A | 11/2007 |
| JP | 2008-294453 A | 12/2008 |
| JP | 2009-147293 A | 7/2009 |
| JP | 2010-050436 | 3/2010 |
| JP | 2010-056263 | 3/2010 |
| JP | 2010-212585 | 9/2010 |
| JP | 2011-018668 A | 1/2011 |
| JP | 2011-100970 A | 5/2011 |
| KR | 10-2007-0048491 | 5/2007 |
| KR | 10-2008-0035123 | 4/2008 |
| KR | 10-0899159 B1 | 5/2009 |
| KR | 10-2012-0133967 | 12/2012 |
| WO | WO 2010016650 A1 * | 2/2010 |
| WO | WO-2010024511 A1 | 3/2010 |

* cited by examiner

SUBSTRATE PROCESSING APPARATUS AND SUBSTRATE PROCESSING METHOD

CROSS-REFERENCE TO RELATED APPLICATIONS

This U.S. non-provisional patent application claims priority under 35 U.S.C. §119 of Korean Patent Application Nos. 10-2011-0052381, filed on May 31, 2011, and 10-2011-0088465, filed on Sep. 1, 2011, the entire contents of which are hereby incorporated by reference.

BACKGROUND OF THE INVENTION

The present invention disclosed herein relates to a substrate processing apparatus, and more particularly, to a substrate processing apparatus which can perform wet and dry cleaning on a substrate and a substrate processing method.

Photomasks are used in a photolithograph process for transferring a predetermined photoresist pattern on a wafer together with an exposure device. Such a photomask includes a predetermined light blocking layer pattern or a phase shift layer pattern on an entire surface thereof. A photomask is manufactured by attaching a pellicle covering a light blocking layer pattern or a phase shift layer pattern on a mask substrate to protect the light blocking layer pattern or the phase shift layer pattern.

Also, a cleaning process is performed on the photomask to remove contaminations occurring due to various factors. The cleaning process is classified into a wet cleaning process using $H_2SO_4$ and a dry cleaning process using ultraviolet rays or heat. The cleaning process may be necessarily performed after a repair process for photomask is performed.

However, to perform the existing photomask cleaning process, an apparatus for the wet cleaning and an apparatus for the dry cleaning should be separately provided. Thus, it may take a relatively long time for the process processing time, and also back contamination may occur due to external exposure of the photomask.

SUMMARY OF THE INVENTION

The present invention provides a substrate processing apparatus and method which can prevent back contamination of a photomask from occurring by reducing external exposure of the photomask.

The present invention also provides a substrate processing apparatus and method which can selectively perform dry and wet cleaning processes.

The object of the present invention is not limited to the aforesaid, and other objects not described herein will be clearly understood by those skilled in the art from descriptions below.

Embodiments of the present invention provide substrate processing apparatuses include: an index part including a port on which a container containing a substrate is placed and an index robot; a processing part for processing the substrate; and a buffer unit disposed between the processing part and the index part to allow the substrate transferred between the processing part and the index part to be temporarily stayed therein, wherein the processing part includes a glue removal processing module, a substrate cooling processing module, a heat processing module, and a functional water processing module which are disposed along a transfer passage for transferring the substrate.

In some embodiments, the processing part may include: a first processing part in which a wet cleaning process is performed on the substrate; and a second processing part stacked on the first processing part to perform dry and functional water cleaning processes on the substrate.

In other embodiments, the first processing part may include a first transfer passage including a first transfer robot for transferring the substrate, and the glue removal processing module and the substrate cooling processing module may be disposed along the first transfer passage on a side of the first transfer passage.

In still other embodiments, the glue removal processing module may include: a high temp sulfuric unit (HSU) which applies a sulfuric peroxide mixture (SPM) solution to an entire of the substrate to remove glue; and a glue removal high temp sulfuric unit (GSU) which partially applies the SPM solution to edges of the substrate to remove glue.

In even other embodiments, the second processing part may include a second transfer passage including a second transfer robot for transferring the substrate, and the heat processing module and the functional water processing module may be disposed on the second transfer passage on a side of the second transfer passage.

In yet other embodiments, the heat processing module may include: a bake plate for performing a baking process; and an UV lamp for performing an UV irradiation process, wherein the baking process and the UV irradiation process may be separately performed or simultaneously performed.

In further embodiments, the functional water processing module selectively may use functional water to remove particles, and the functional water may include deionized water containing $CO_2$, deionized water containing $H_2$, and deionized water containing $O_3$.

In still further embodiments, an ionizer may be disposed in the transfer passage.

In even further embodiments, the buffer unit may include: a first buffer on which the substrate is placed; a driving part for reversing the first buffer; and a frame having a central area on which the first buffer is disposed and having opened front and rear surfaces and a driving part area on which the driving part is disposed and disposed on both sides of the central area.

In yet further embodiments, the first buffer may include: a first support part for supporting one surface of the substrate; and a second support part facing the first support part, the second support part supporting the other surface of the substrate placed on the first support part, wherein the driving part may include: a rotation module for rotating the first and second support parts; and an elevation module for elevating the second support part so that the substrate is gripped on the first and second support parts.

In much further embodiment, a rotation axis of the first buffer may be eccentric from a center of the gripped position of the substrate so that a loading position of the substrate is the same as an unloading position of the substrate after the substrate is reversed.

In still much further embodiment, the heat processing module may include: a bake plate on which the substrate is loaded; a main body on which the bake plate is disposed, the main body having an opened top surface and a side surface in which an entrance hole for taking the substrate in or out is defined; a cover for opening or closing the opened top surface of the main body; and UV lamps disposed in the cover to irradiate UV lays onto the substrate.

In even much further embodiment, substrate processing apparatuses may further include: left pins for supporting the substrate taken in or out through the entrance hole; a first elevation driving part for elevating the substrate supported by the lift pins between the bake plate and the UV lamps; and a second elevation driving part for elevating the bake plate, wherein the first elevation driving part may elevate the substrate: at a load/unloading position at which the substrate is taken in or out through the entrance hole; at a bake position lower than the loading/unloading position and at which the substrate is seated on the bake plate to perform a baking process on the substrate; and at an UV irradiation position higher than the loading/unloading position and at which the substrate approaches the UV lamps to perform the UV irradiation process on the substrate, and the second elevation driving part may elevate the bake plate to the UV irradiation position approaching the UV lamps to perform the UV irradiation process on the substrate.

In yet much further embodiment, the substrate cooling processing module may include: a chamber; and a cooling unit disposed in an inner space of the chamber, wherein the cooling unit may include: first and second support frames spaced from each other; a cooling plate disposed inside the first and second support frames and on which the substrate is placed; lift pins disposed under the cooling plate; and a driving part disposed outside the first and second support frames to lift the lift pins up and down.

In still even much further embodiment, the cooling unit may further include a space-partitioning cover covering outer surfaces of the first and second support frames so that a driving part space in which the driving part is disposed is partitioned from an inner space of the chamber.

In yet even much further embodiment, each of the first and second transfer robots may include: a base; at least one hand including a pocket part, the at least one hand being moved from a home position defined above the base to a pick-up position at which the substrate is picked up; an alignment part for aligning the substrate in position when the at least one hand returns from the pick-up position to the home position; and an gantry spaced from a top surface of the base and on which the alignment part is disposed.

In other embodiments of the present invention, substrate processing methods include: providing a substrate contained in a container into an index part; transferring the substrate from the index part into a processing part in which a cleaning process is performed; and performing the cleaning process on the substrate in the processing part, wherein the cleaning process includes: removing glue from the substrate; and removing particles from a surface of the substrate in which the glue is removed.

In some embodiments, the cleaning process may further include: baking the substrate and irradiating UV lays onto the substrate between the glue removal process and the particle removal process; and cooling the substrate.

In other embodiments, a buffer unit in which the substrate may be temporarily stayed is disposed between the index part and the processing part to reverse the substrate transferred between the index part and the processing part when the substrate is stayed in the buffer unit.

In still other embodiments, the removing of the glue may include: processing a surface of the substrate using a sulfuric peroxide mixture (SPM) solution; processing the surface of the substrate using hot deionized water; processing the surface of the substrate using an RCA standard cleaning solution (standard clean 1 (SC-1)); processing the surface of the substrate using a rinsing solution; and drying the surface of the substrate, wherein the removing of the particles may include removing particles and organic matters remaining on the surface of the substrate using deionized water containing $CO_2$, deionized water containing $H_2$, and deionized water containing $O_3$.

In even other embodiments, the substrate may include a photomask.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
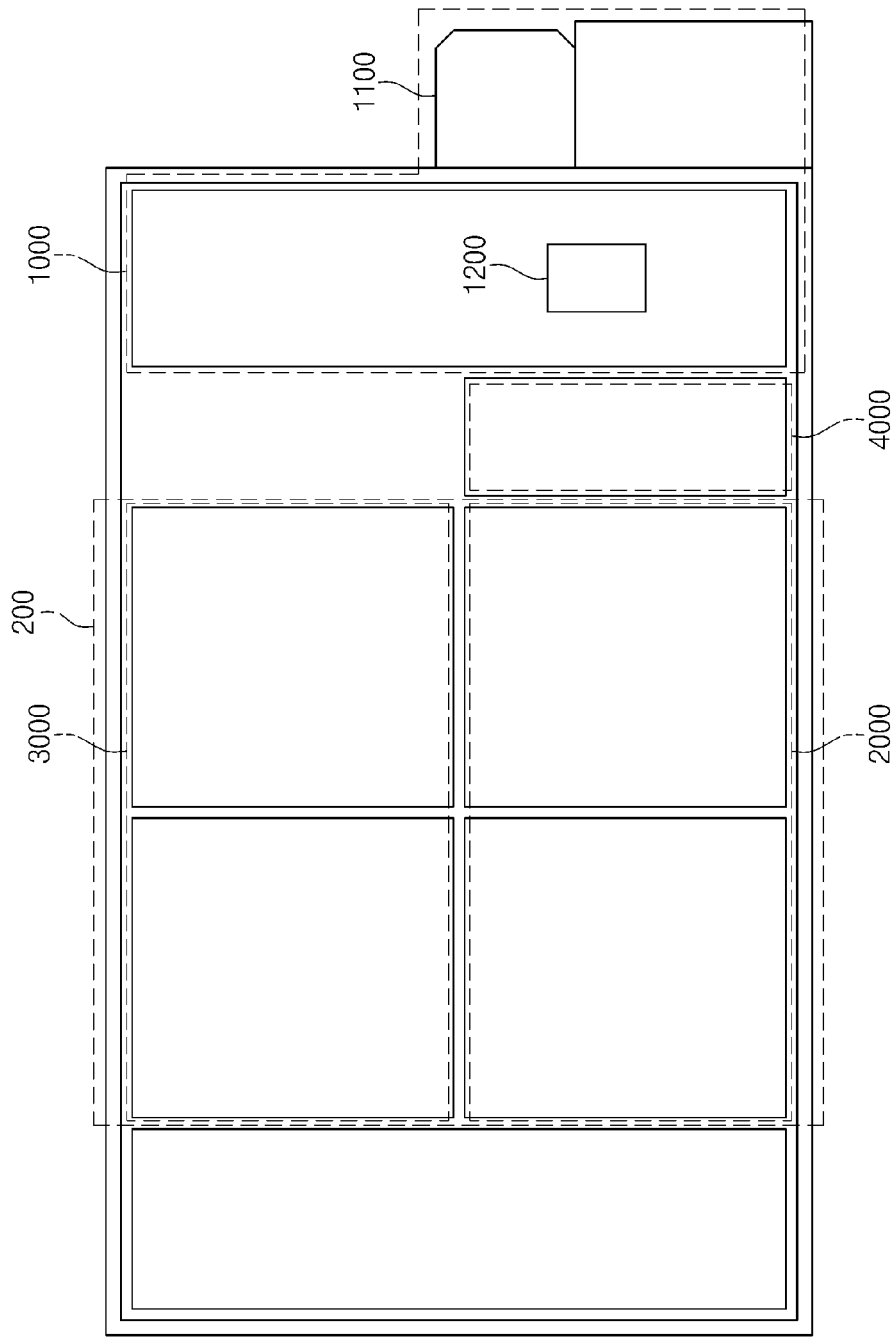
FIG. 1 is a view of a photomask cleaning apparatus according to an embodiment of the present invention.

Hereinafter, a substrate processing apparatus according to exemplary embodiments of the present invention will be described in detail with reference to the accompanying drawings. Like reference numerals denote like elements throughout. Moreover, detailed descriptions related to well-known functions or configurations will be ruled out in order not to unnecessarily obscure subject matters of the present invention.

(Embodiments)

FIG. 1 is a view of a photomask cleaning apparatus according to an embodiment of the present invention.

Figure 2:
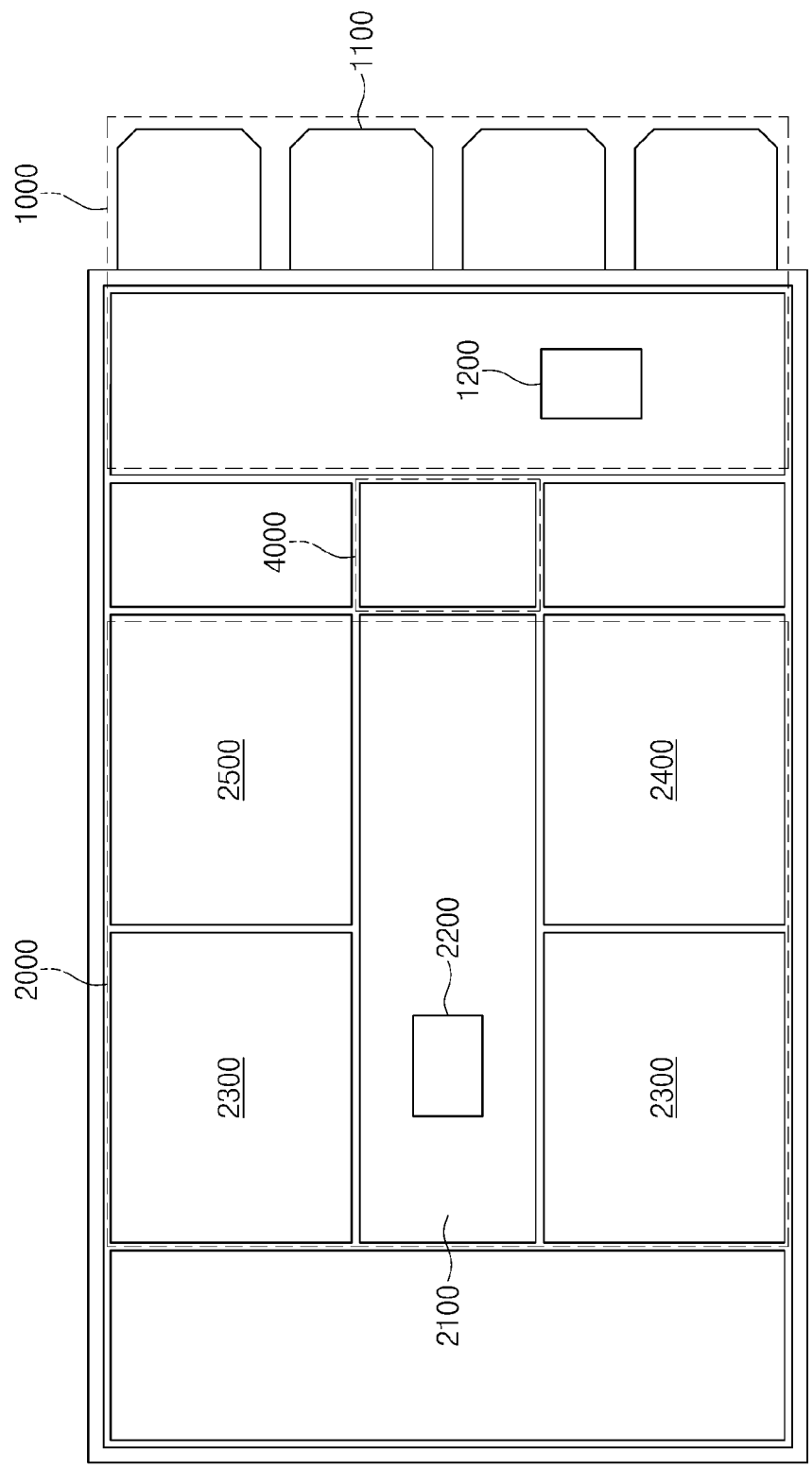
FIG. 2 is a view illustrating a first floor layout of the photomask cleaning apparatus of FIG. 1.
Figure 3:
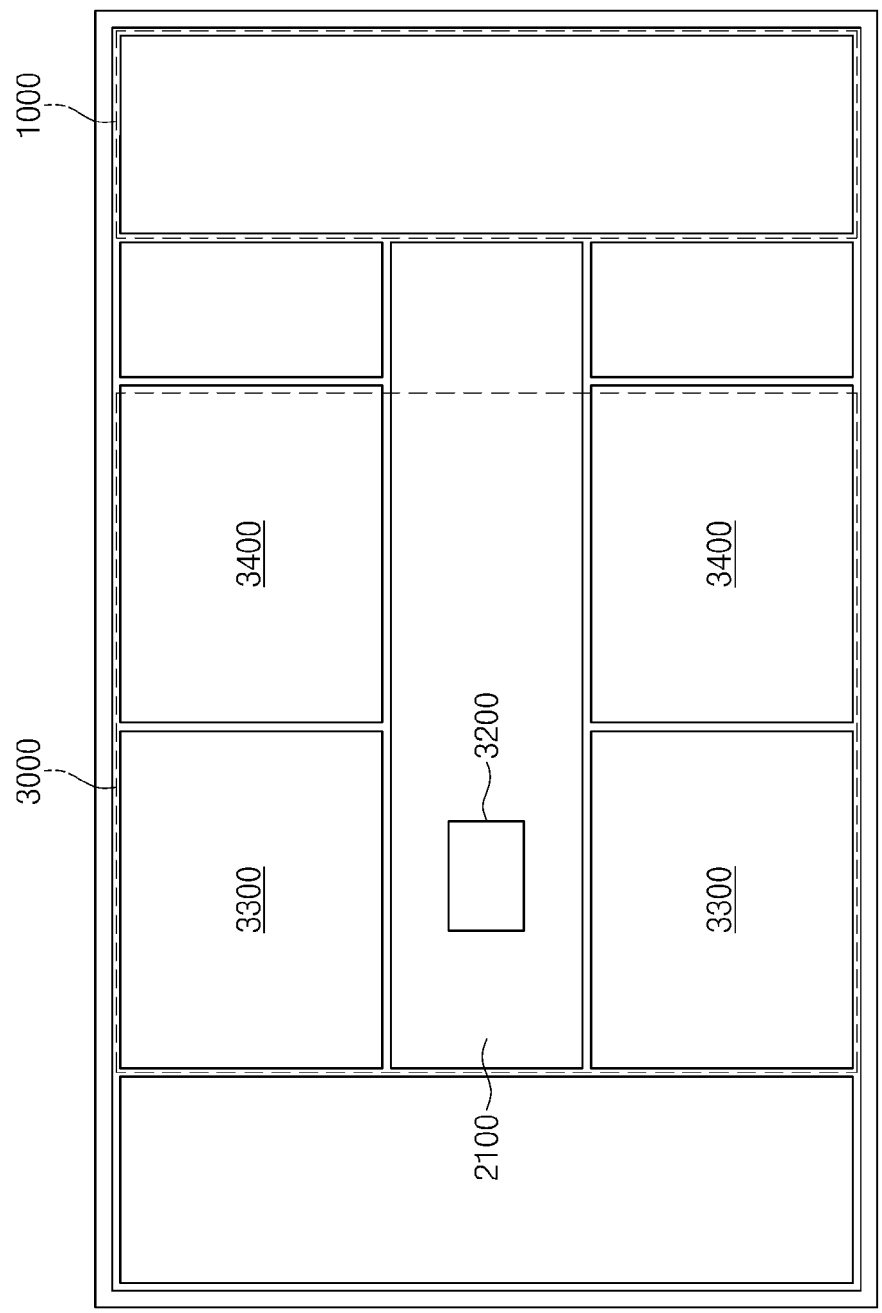
FIG. 3 is a view illustrating a second floor layout of the photomask cleaning apparatus of FIG. 1.

FIGS. 2 and 3 are views illustrating first and second floor layouts of the substrate processing apparatus of FIG. 1.

In this embodiment, a photomask is exemplified as a substrate. However, various substrates such as a semiconductor wafer and a flat display panel may be exemplified as the substrate. Also, in this embodiment, an apparatus for cleaning a photomask is exemplified as the substrate processing apparatus. However, the substrate processing apparatus may be an apparatus for performing the cleaning process on different kinds of substrates such as a wafer. Alternatively, the substrate processing apparatus may be an apparatus for performing different kinds of processes in which a substrate should be reversed, except for the cleaning process for substrates such as a photomask and a wafer.

Referring to FIGS. 1 to 3, a substrate processing apparatus 1 includes an index part 1000, a processing part 200, and a buffer unit 4000.

The index part 1000 includes four ports 1100 on which containers containing photomasks are placed, respectively, and an index robot 1200 for transferring the photomasks. Each of the photomasks is transferred in a state where the photomask is contained in each of the containers. Also, the photomask is contained in the container so that a pattern surface thereof is oriented downward. Thus, contamination of the pattern surface may be minimized during the transferring of the photomask. Before the photomask is transferred into a first processing part 2000 or a second processing part 3000, the photomask is reversed again in the buffer unit 4000 so that the pattern surface is oriented upward.

The processing part 200 includes the first processing part 2000 and the second processing part 3000. A wet cleaning process is performed on a photomask in the first processing part 2000. The first processing part 2000 is connected to the buffer unit 4000. Also, the first processing part 2000 includes a first transfer passage 2100 including a first transfer robot 2200 for transferring a photomask, glue removal processing module (HSU and GSU) 2300 and 2400 disposed along the first transfer passage 2100, and a photomask cooling processing module (CPU) 2500.

For example, tree glue removal processing modules may be provided, and two photomask cooling processing modules may be provided.

The glue removal processing modules 2300 and 2400 may include a high temp sulfuric unit (HSU) 2300 which applies a sulfuric peroxide mixture (SPM) solution to an entire of the photomask to remove glue and a glue removal high temp sulfuric unit (GSU) 2400 which partially applies a SPM solution to edges of the photomask to remove glue. The CPU 2500 cools a photomask heated in a heat processing module 3300 into room temperature.

Here, the SPM solution is a mixed solution of $H_2SO_4$ and $H_2O_2$. Also, the SPM solution may be used at a high temperature to remove organic matters from a surface of a substrate.

The first processing part 2000 and the second processing part 300 are disposed on different floors. A dry and functional water cleaning process is performed on a photomask in the second processing part 3000. The second processing part 3000 includes a second transfer passage 3100 including a second transfer robot 3200 for transferring a photomask, a heat processing modules (HPU) 3300, and a functional water processing modules (SCU) 3400. Here, the HPU 3300 and the SCU 3400 are disposed along the second transfer passage 3100. The heat processing modules 3300 may heat a photomask using ultraviolet rays. For example, two heat processing modules 3300 may be provided, and two functional water processing modules 3400 may be provided.

The SCU 3400 may remove particles or organic matters from a surface of a substrate. Functional water may include deionized water (antistatic) containing $CO_2$, deionized water (used together with mega sonic to remove particles) containing $H_2$, and deionized water (for removing organic matters) containing $O_3$.

The buffer unit 4000 is disposed between the processing part 200 and the index part 1000. For example, the buffer unit 4000 is disposed between the first processing part 2000 and the index part 1000. Alternatively, the buffer unit 4000 may be disposed between the second processing part 3000 and the index part 1000. The buffer unit 4000 reverses a photomask.

In the substrate processing apparatus 1, modules for performing a wet cleaning process are disposed on a first floor, and modules for performing a dry cleaning process are disposed on a second floor. That is, a wet cleaning process using a chemical solution is performed on the first floor so as to protect a dry-processed photomask from ion contamination due to a down flow.

Figure 4:
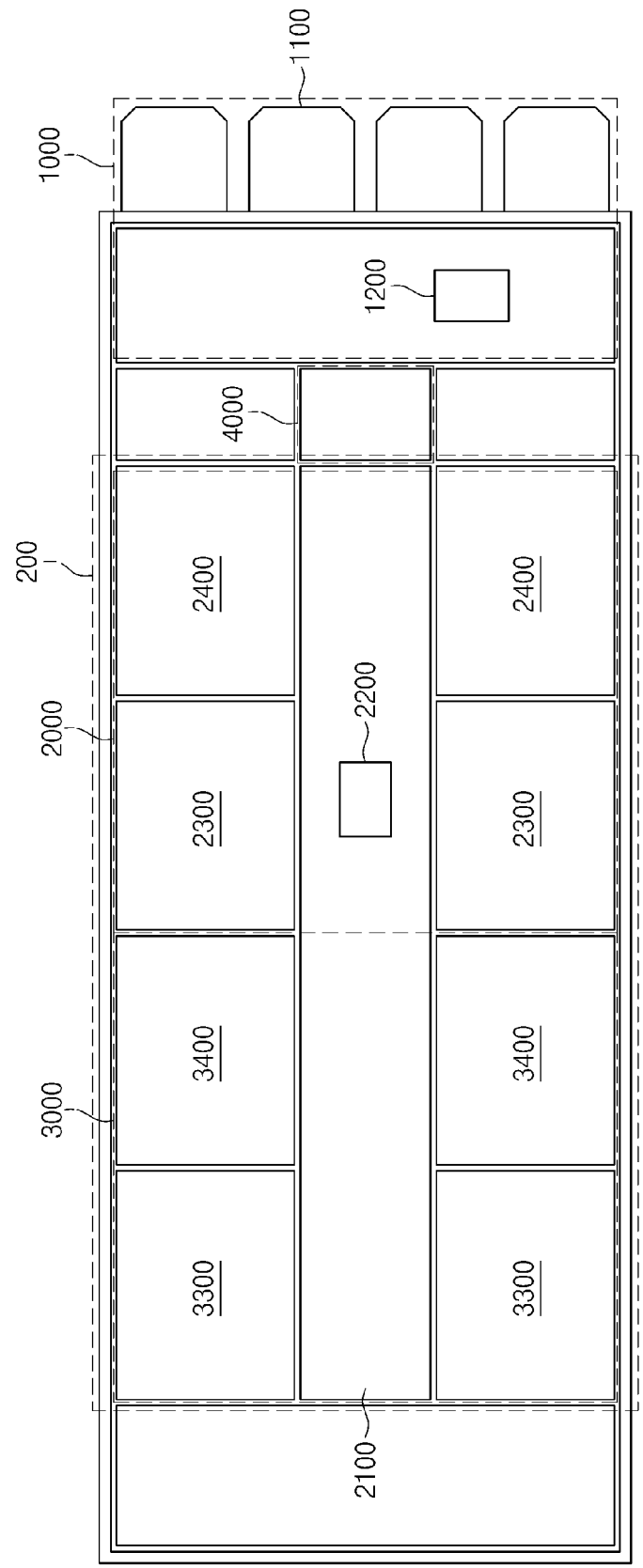
FIG. 4 is a view of a substrate processing apparatus having a single floor structure.

FIG. 4 is a view of a substrate processing apparatus having a single floor structure.

Referring to FIG. 4, a substrate processing apparatus has a single floor structure. That is, modules for performing wet and dry cleaning processes are disposed along a transfer passage on a side portion of the transfer passage including a transfer robot.

In this embodiment, a processing part includes a glue removal processing module, a photomask cooling processing module, a heat processing module, and a functional water processing module. However, the types of processing modules constituting the processing part may be varied according to the type of a substrate to be processed, and a processing process thereof.

A substrate processing apparatus may process five photomasks at the same time to improve productivity.

Since a pattern surface of a photomask includes chrome (Cr), the pattern surface is susceptible to static electricity. Thus, a substrate processing apparatus according to an embodiment of the present invention may includes ionizers within moving passages (a first transfer passage, a second transfer passage, and the inside of each of processing modules) to minimize damage due to the static electricity.

Figure 5:
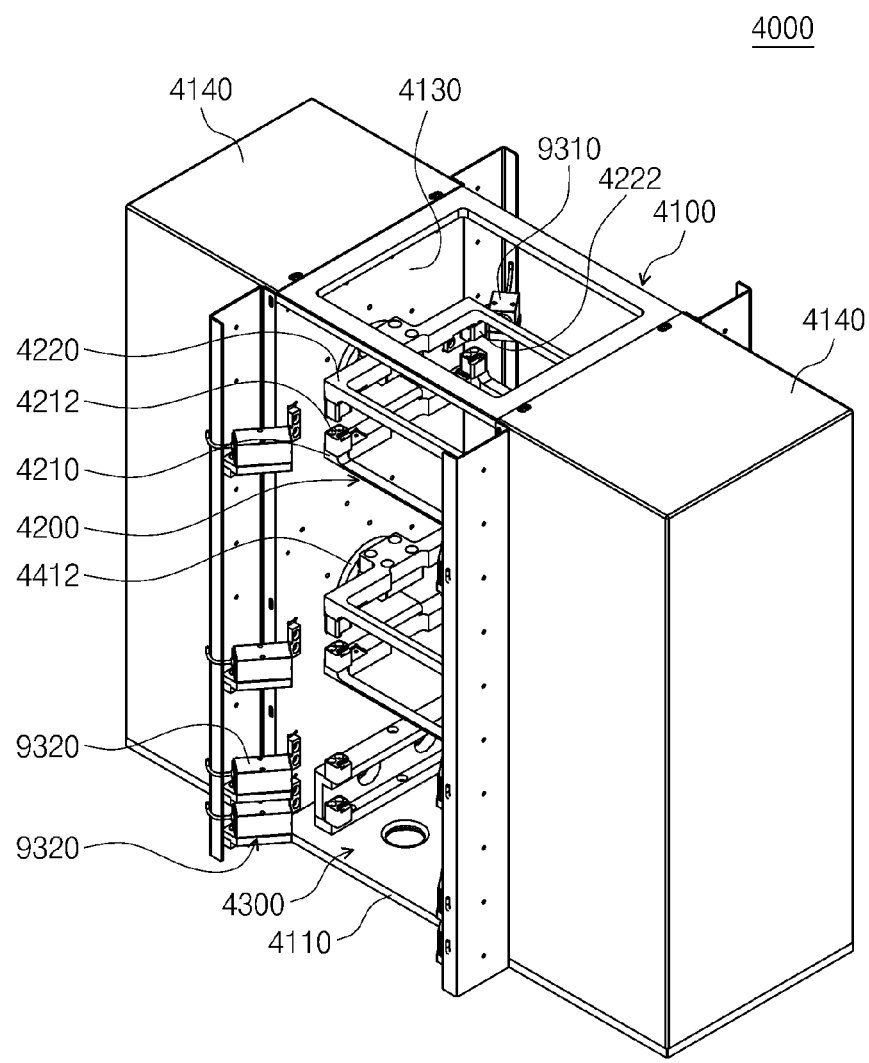
FIG. 5 is a perspective view of a buffer unit.
Figure 6:
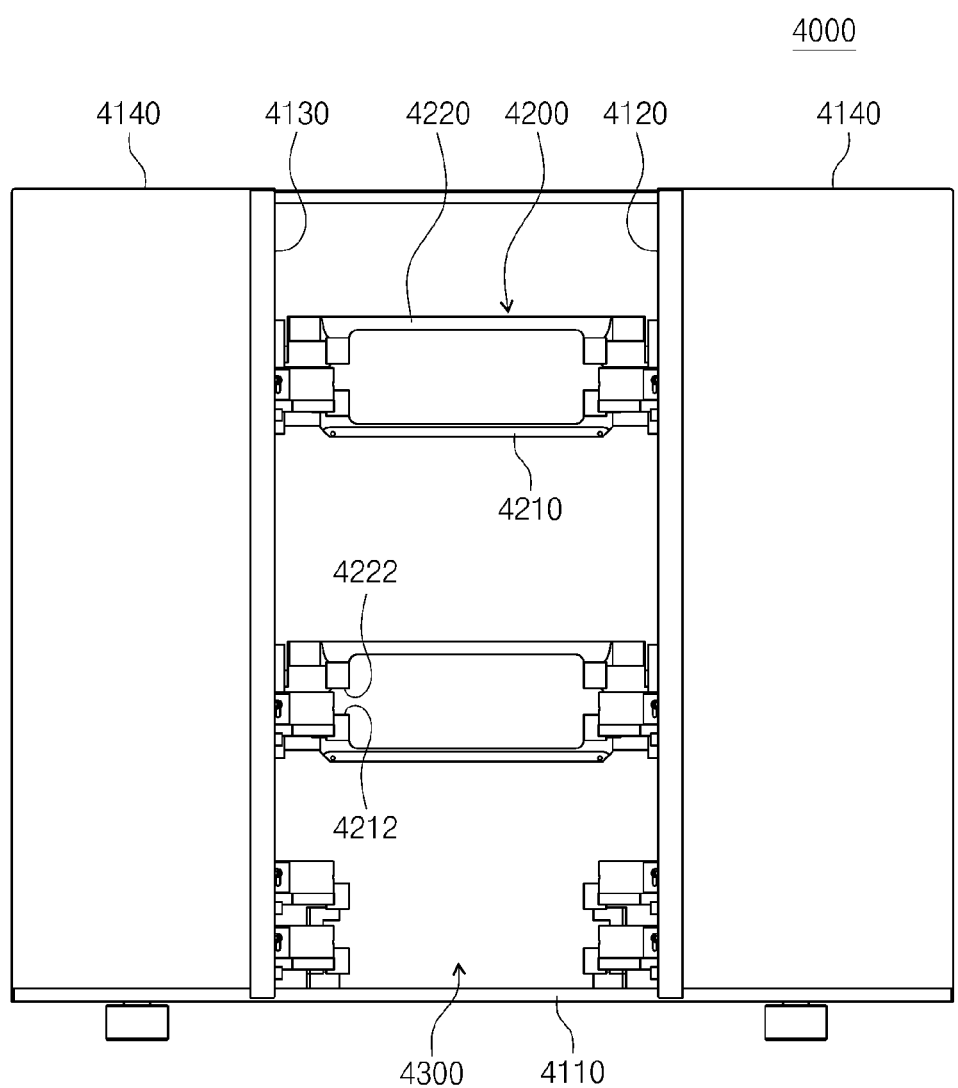
FIG. 6 is a front view of the buffer unit.
Figure 7:
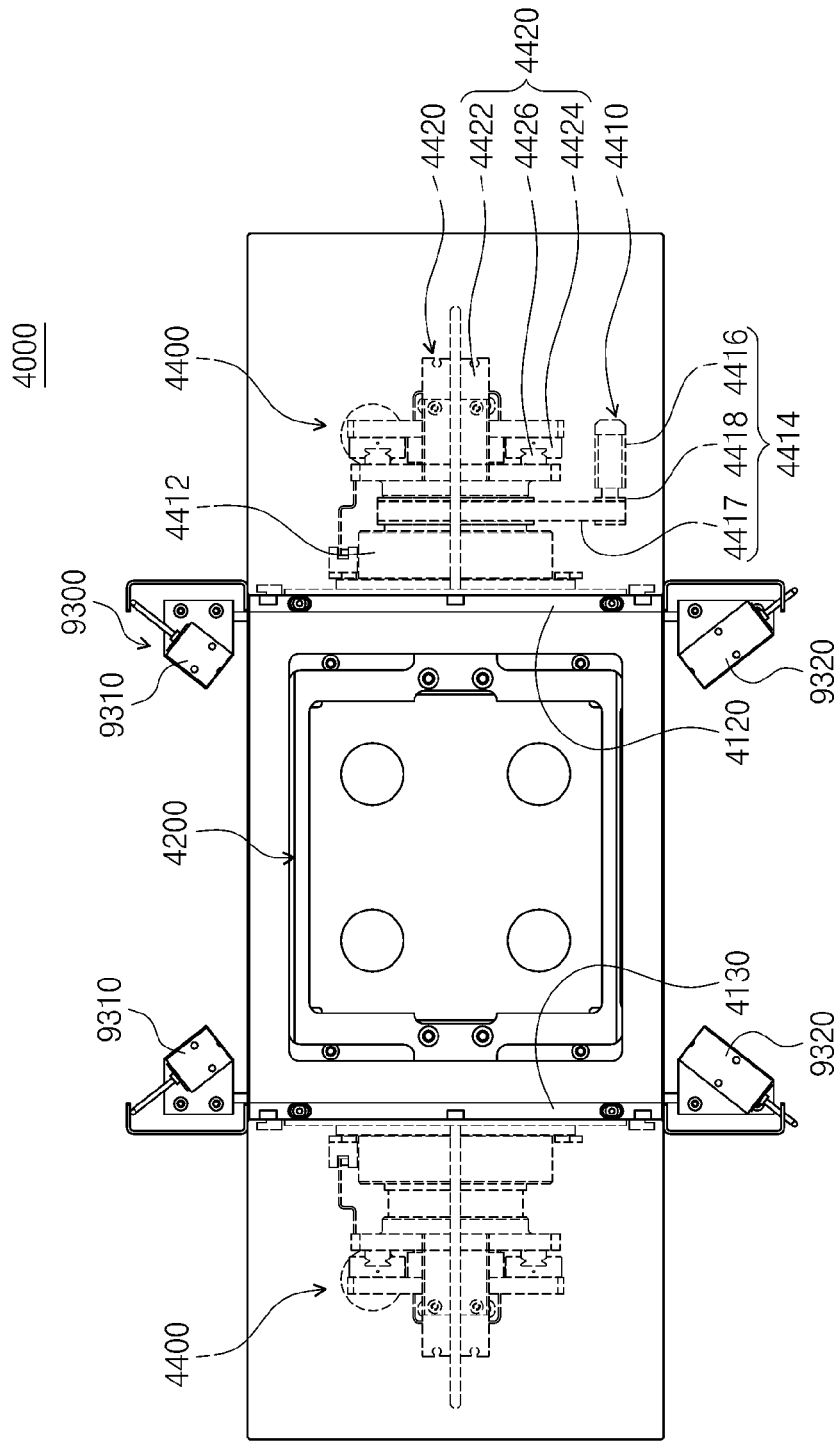
FIG. 7 is a plan view of the buffer unit.
Figure 8:
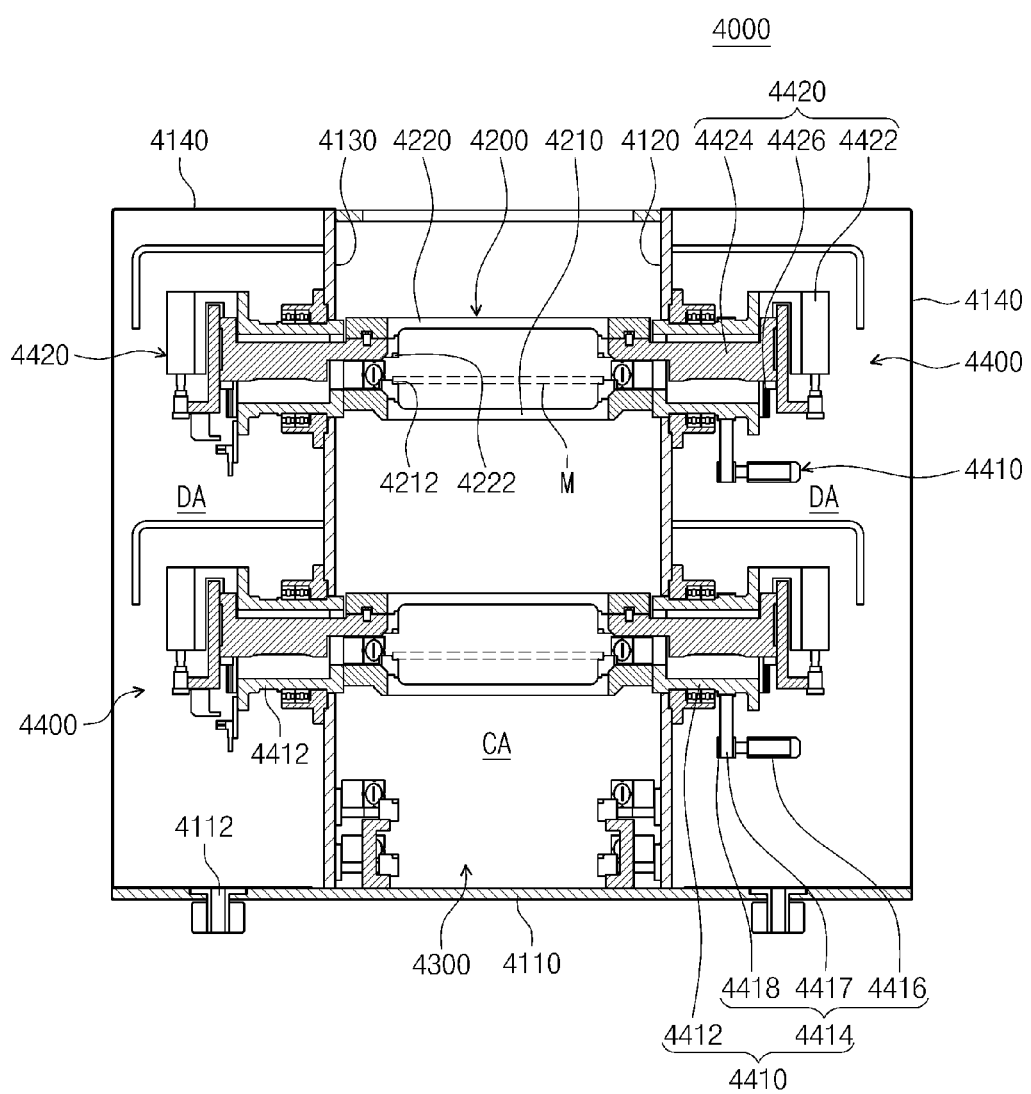
FIG. 8 is a sectional view of the buffer unit.

FIG. 5 is a perspective view of a buffer unit, FIG. 6 is a front view of the buffer unit, and FIG. 7 is a plan view of the buffer unit. FIG. 8 is a sectional view of the buffer unit.

Referring to FIGS. 5 to 8, the buffer unit 4000 includes a frame 4100, a first buffer 4200 having a reversing function, a second buffer 4300 having a simple buffer function, and a driving part 4400. Here, two first buffers and two second buffers may be provided.

The frame 4100 includes a base plate 4110, a first vertical plate 4120, a second vertical plate 4130, and two space-partitioning covers 4140.

The first vertical plate 4120 and the second vertical plate 4130 are perpendicular to the base plate 4110. The first vertical plate 4120 and the second vertical plate 4130 are spaced from each other. A space between the first and second vertical plates 4120 and 4130 is referred to as a central space CA (in which a photomask is stored and reversed). A right space of the first vertical plate 4120 and a left space of the second vertical plate 4130 are referred to as driving part spaces DA, respectively. The central space CA has an open front portion and an open rear portion through which a photomask is put in or taken out. The first buffers 4200 and the second buffer 4300 are arranged in a multi-stage structure within the central space CA. The driving part 4400 is disposed within each of the driving part space DA. The driving part space DA is isolated from an external environment by the space-partitioning cover 4140. The base plate 4110 of the frame 4100 includes intake port 4112 to form a discharge pressure (negative pressure) within the driving part space DA. That is, the driving part space DA is isolated from the external environment by the space-partitioning cover 4140. Also, in the driving part space DA, the negative pressure (discharge pressure) is formed by the intake port 4112 to prevent air from flowing from the driving part space DA to the central space CA.

The second buffer 4300 is disposed under the first buffers 4200. Also, the second buffer 4300 has a simple buffer function.

The first buffer 4200 is rotatably installed on the first and second vertical plates 4120 and 4130. The first buffer 4200 includes a fixing holder 4210 as a first support and a gripper holder 4220 as a second support. The fixing holder 4210 faces the gripper holder 4220. The gripper holder 4220 vertically moves to hold an edge of a photomask M placed on the fixing holder 4210. When viewed in plan, the fixing holder 4210 and the gripper holder 4220 have a square frame shape on the whole. Each of the fixing holder 4210 and the gripper holder 4220 includes support protrusions 4212 and 4222 (see FIG. 4) at each of edges thereof. Here, edges of the photomask M are seated on the support protrusions 4212 and 4222.

The driving part 4400 includes a rotation module 4410 and an elevation module 4420. The driving part 4400 is disposed within the driving part space DA to prevent back contamination of a photomask from occurring due to particles generated in the driving part 4400.

The rotation module 4410 includes two rotors 4412 and one rotation driving part 4414.

The rotors 4412 are disposed to correspond to the first and second vertical plates 4120 and 4130, respectively. The rotation driving part 4414 is disposed on the first vertical plate 4120. The rotation driving part 4414 includes a motor 4416, a belt 4417, and a pulley 4418 to reverse the rotors 4412 to about 180°. Each of the rotors 4412 has a hollow structure with an inner passage. Both ends of the fixing holder 4210 are fixed to the rotors 4412, respectively.

The elevation module 4420 includes a cylinder 4422, a connection block 4424, and a linear motion (LM) guide 4426. The cylinder 4422 is fixed to the outside of the rotor 4412 disposed in the driving part space DA. The connection block 4424 is vertically moved according to driving of the cylinder 4422. The LM guide 4426 is fixed to the rotor 4412. The LM guide 4426 guides the connection block 4424 that is vertically moved according to the driving of the cylinder 4422. The connection block 4424 is connected to the gripper holder 4220 disposed within the central space CA through the inner passage of the rotor 4412.

The buffer unit 4000 may include only one first buffer having a reversing function. Also, the buffer unit may include one first buffer and one second buffer. Alternatively, as shown in FIG. 6, the buffer unit may include first and second buffers which have numbers different from each other. Also, the first and second buffers may be changed in position.

The buffer unit 400 includes detection members 9300 for detecting whether the photomask M is unstably mounted. The detection members 9300 are disposed at photomask loading/unloading heights of the first and second buffers 4200 and 4300, respectively. The detection members 9300 are diagonally disposed for a cross check.

Figure 9:
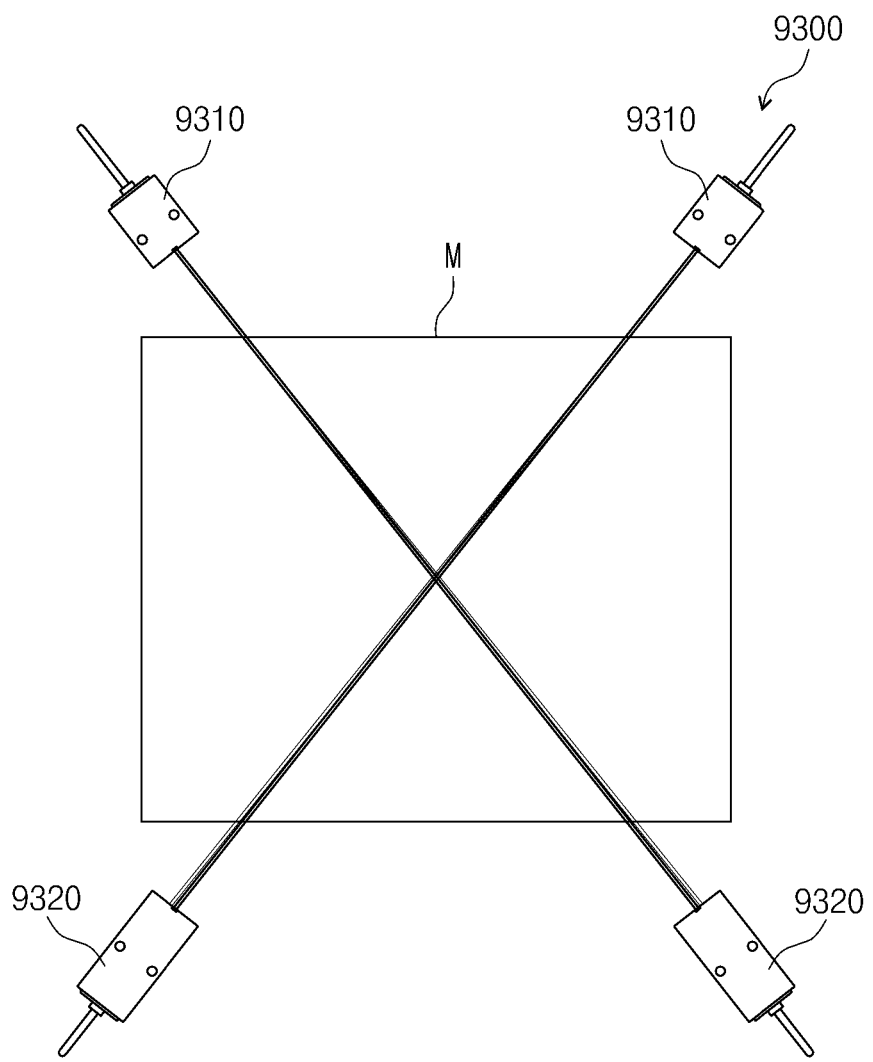
FIGS. 9 and 10 are plan and side views illustrating a detection member of FIG. 7, respectively.
Figure 10:
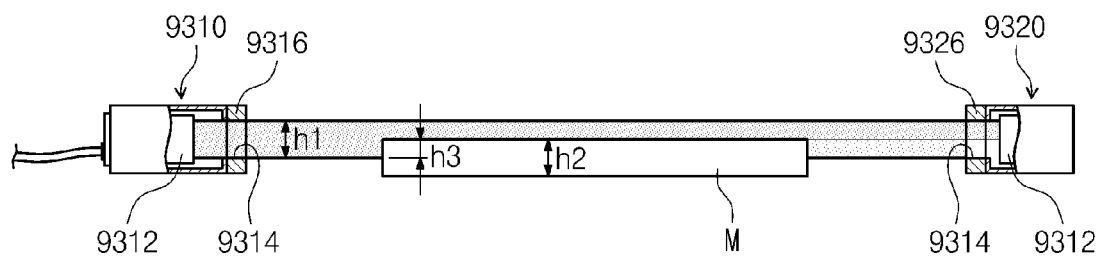
Figure 11:
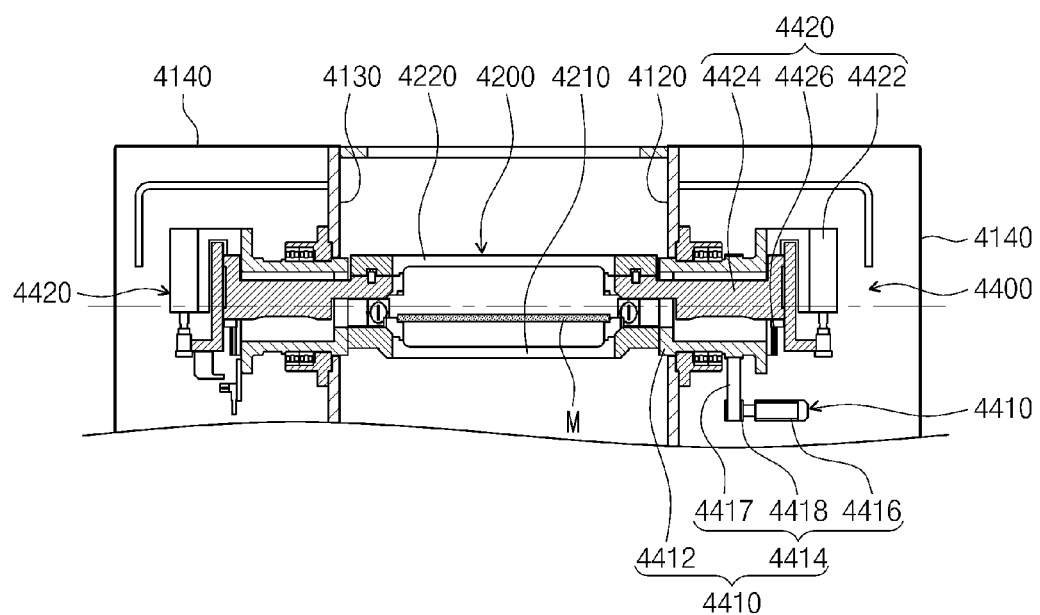
FIGS. 11 to 14 are views illustrating a process for gradationally reversing a photomask in a first buffer.
Figure 12:
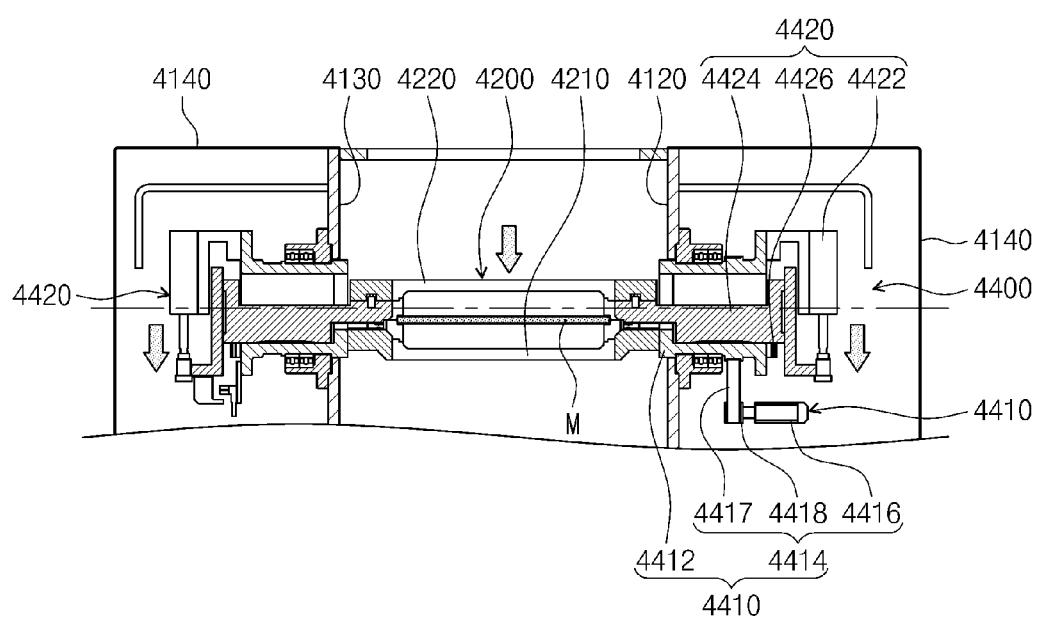
Figure 13:
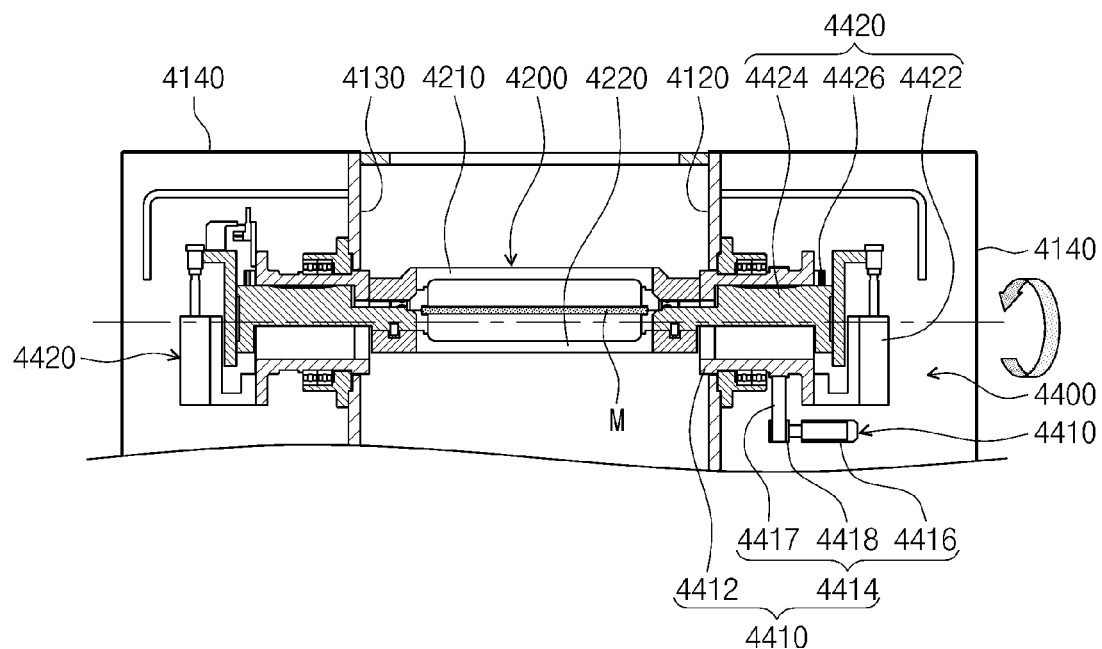
Figure 14:
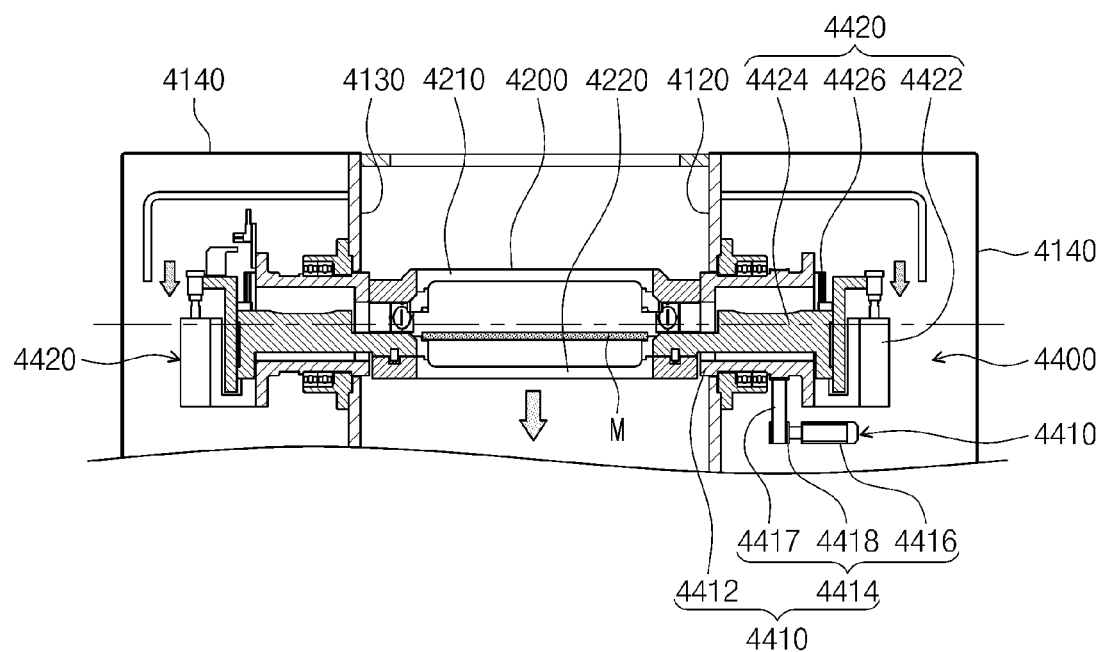

FIGS. 9 and 10 are plan and side views illustrating a detection member of FIG. 7, respectively. Referring to FIGS. 9 and 10, the detection members 9300 are disposed around corresponding buffers. The detection members 9300 may simultaneously detect the presence of the photomask M and photomask loading failure. Each of the detection members 9300 includes a pair of a light emitting part 9310 and a light receiving part 9320. The light emitting part 9310 emits a laser beam, and the light receiving part 9320 receives the laser beam. The light emitting part 9310 and the light receiving part 9320 are disposed to propagate a laser beam along a diagonal direction of the photomask M. That is, the laser beam is inclinedly incident from a side of the photomask M.

The light emitting part 9310 includes a light emitting sensor 9312 emitting a laser beam, and a first light blocking plate 9316 including a first slit window 9314 limiting a beam width of a laser beam. A laser beam emitted from the light emitting part 9310 has a vertical slit shape in section.

The light receiving part 9320 includes a second light blocking plate 9326 including a second slit window 9324 through which a laser beam emitted from the light emitting part 9310 passes and a light receiving sensor 9322 disposed at a rear side of the second light blocking plate 9326 to detect an intensity of a laser beam incident through the second slit window 9324.

The laser beam has a height h1 greater than that h2 of the photomask M. The laser beam may pass through a portion of the photomask M. For example, when the photomask M has a height (thickness) of about 6.35 mm, and the laser beam has a height h1 of about 10 mm, a portion of the laser beam passing through the photomask M may have a height h3 of about 5 mm to efficiently detect the presence of the photomask M and the photomask loading failure. That is, a half (a height of 5 mm) of the laser beam may pass through the photomask M. Since the portion of the laser beam (passing through the photomask M) is obliquely incident to a side surface of the photomask M, the portion of the laser beam is refracted while passing the photomask M, and thus, is not incident into the second slit window 9324 of the light receiving part 9320. Thus, only a portion of the laser beam passing over a top surface of the photomask M may be incident into the second slit window 9324 so that a sensing intensity of the laser beam is decreased.

FIGS. 11 to 14 are views illustrating a process for gradationally reversing a photomask in a first buffer.

Referring to FIGS. 11 to 14, the photomask M is transferred into the central space CA of the buffer unit 4000 by a transfer device (not shown) and then is loaded to the fixing holder 4210. When the photomask M is loaded to the fixing holder 4210, the gripper holder 4220 moved downward by the elevation module 4420 to support the photomask M from an upper portion thereof. When the photomask M is fixed by the fixing holder 4210 and the gripper holder 4220, the first buffer 4200 is reversed by the rotation module 4410. After that, the gripper holder 4220 is disposed at the lower side, and the fixing holder 4210 is disposed at the upper side. The gripper holder 4220 is moved downward by the elevation module 4420 to release the holding of the photomask M. Here, the photomask M held by the gripper holder 4220 is moved to a loading/unloading position.

At this point, a rotation axis of the photomask M (depicted with dot-dash line) is disposed above the photomask M. That is, the rotation axis of the photomask M is eccentric from the center of a placement position of the photomask M (the loading/unloading position thereof) so that the initial loading position of the photomask M is the same as an unloading position after the reversing of the photomask M.

Figure 15:
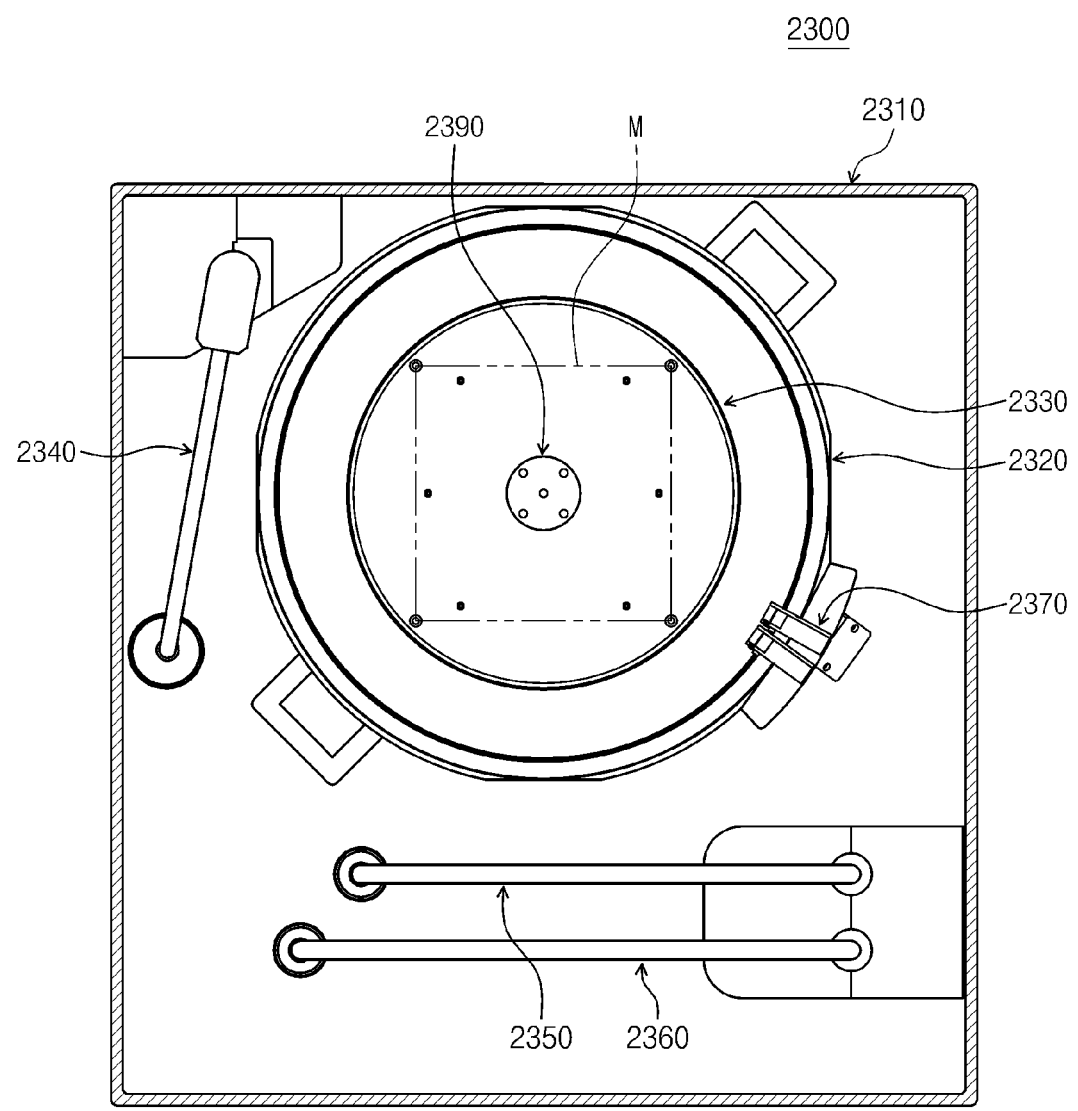
FIG. 15 is a plan view illustrating a high temp sulfuric unit (HSU) of FIG. 2.

FIG. 15 is a plan view illustrating a high temp sulfuric unit (HSU) of FIG. 2.

Referring to FIG. 15, a HSU 2300 is a unit for removing glue and particles from a surface of a photomask using various processing fluids.

The HSU 2300 includes a chamber 2310, a processing container 2320, a photomask support member 2330, a first swing nozzle unit 2340, a second swing nozzle unit 2350, an aerosol/liquid nozzle unit 2360, a fixed nozzle unit 2370, and a back nozzle unit 2390.

The chamber 2310 provides a sealed inner space. A vertical air current may be generated within the chamber 2310 by a fan filter unit (not shown) disposed on an upper portion of the chamber 2310. The processing container 2320 has a cylindrical shape with an opened upper side. Also, the processing container 2320 provides a processing space for processing a photomask M. The photomask M may be put in or taken out through the opened top side of the processing container 2320. The photomask support member 2330 is disposed inside the processing container 2320. The photomask support member 2330 supports and rotates the photomask M during the performance of the processes.

The fixed nozzle unit 2370 is fixed to an upper end of the processing container 2320 to supply deionized water containing $N_2$ and $CO_2$ onto a center of the photomask M. The first swing nozzle unit 2340 is moved to an upper side of the center of the photomask M through a swing motion thereof to supply a fluid for removing glue onto the photomask M. The fluid may include a SPM solution and hot deionized water (Hot DIW). The second swing nozzle unit 2350 is moved to an upper side of the center of the photomask M through a swing motion thereof to supply a fluid for removing organic matters onto the photomask M. The fluid may include DIW containing $O_3$. The aerosol/liquid nozzle unit 2360 is moved to an upper side of the center of the photomask M through a swing motion thereof to supply a liquid or aerosol fluid for cleaning onto the photomask M. The fluid may include a RCA standard cleaning solution (standard clean 1 (SC-1)), a chemical solution such as NH40H+DIW, DIW and SC-1 (sprayed in an aerosol state) containing $CO_2$, and NH40H+DIW+$N_2$ (sprayed in an aerosol state). The back nozzle unit 2390 supplies DIW containing SC-1, $N_2$, SPM, and $CO_2$ onto a back surface of the photomask M.

In the HSU 2300, the glue may be removed through following supply processes: supply of SPM->supply of Hot DIW->supply of SC-1->supply of rinsing solution (DIW containing $CO_2$)->supply of dry gas.

Figure 16:
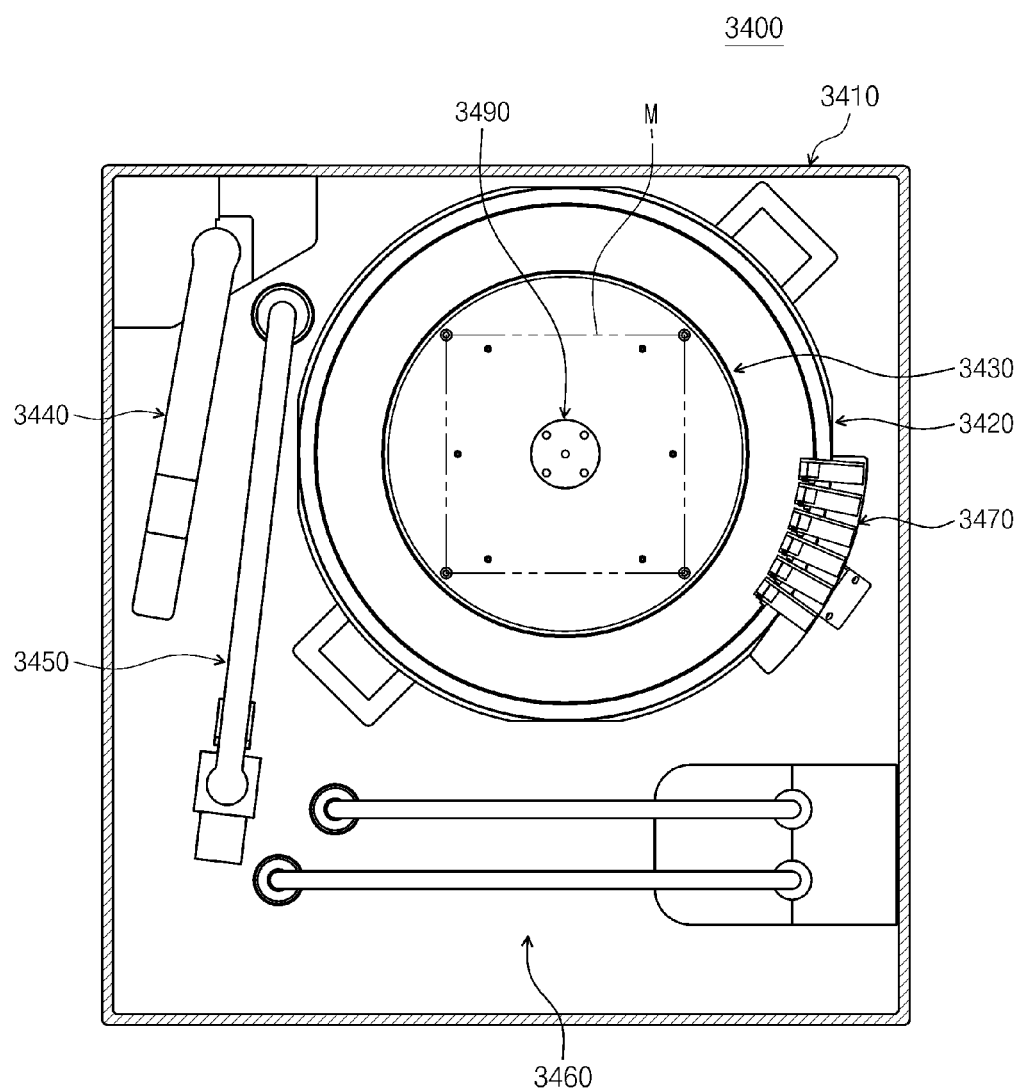
FIG. 16 is a plan view illustrating a functional water processing module of FIG. 3.

FIG. 16 is a plan view illustrating a functional water processing module of FIG. 3.

Referring to FIG. 16, the SCU 3400 removes particles remaining on a surface of the photomask M using various functional water.

The SCU 3400 includes a chamber 3410, a processing container 3420, a photomask support member 3430, an aerosol nozzle unit 3440, a mega sonic nozzle unit 3450, a swing nozzle unit 3460, a fixed nozzle unit 3470, and a back nozzle unit 3490.

The chamber 3410 provides a sealed inner space. A vertical air current may be generated within the chamber 3410 by a fan filter unit (not shown) disposed on an upper portion of the chamber 2310. The processing container 3420 has a cylindrical shape with an opened upper side. Also, the processing container 2320 provides a processing space for processing a photomask. The photomask may be put in or taken out through the opened top side of the processing container 3420. The photomask support member 3420 is disposed inside the processing container 3430. The photomask support member 3430 supports and rotates the photomask during the performance of the processes.

The fixed nozzle unit 3470 is fixed to an upper end of the processing container 3420 to supply ultrapure water containing $N_2$ and $CO_2$ onto a center of the photomask. The aerosol nozzle unit 3440 is moved to an upper side of a center of a photomask M through a swing motion thereof to supply a fluid for cleaning onto the photomask M. The fluid may include DIW containing Hot DIW, $H_2$+DIW, $N_2$, SC-1, and $CO_2$. The mega sonic nozzle unit 3450 is moved to an upper side of the center of a photomask M through a swing motion thereof to supply a cleaning solution onto the photomask M. The cleaning solution may include DIW containing $CO_2$, and $H_2$+DIW. The mega sonic nozzle unit 2350 may provide high-frequency mega sonic energy to the cleaning solution sprayed onto the photomask M to generate vibration of the cleaning solution. Thus, a strong acoustic stream may be generated in the fluid to remove contamination particles from a surface of the photomask M.

The swing nozzle unit 2360 is moved to an upper side of the center of the photomask M through a swing motion thereof to supply functional water for cleaning onto the photomask M. The functional water may include DIW containing $H_2$ for removing particles and DIW containing $O_3$ for removing organic matters. The back nozzle unit 3490 supplies functional water and nitrogen gas onto a back surface of the photomask M. The functional water may include DIW containing $CO_2$, $H_2$+DIW, and $O_3$+DIW.

In the SCU 3400, the cleaning process may be performed through following supply processes: supply of $H_2$+DIW in an aerosol state->supply of SC-1->supply of DIW containing $CO_2$ (supply of mega sonic energy)->supply of rinse (functional water)->supply of dry gas ($N_2$).

Figure 17:
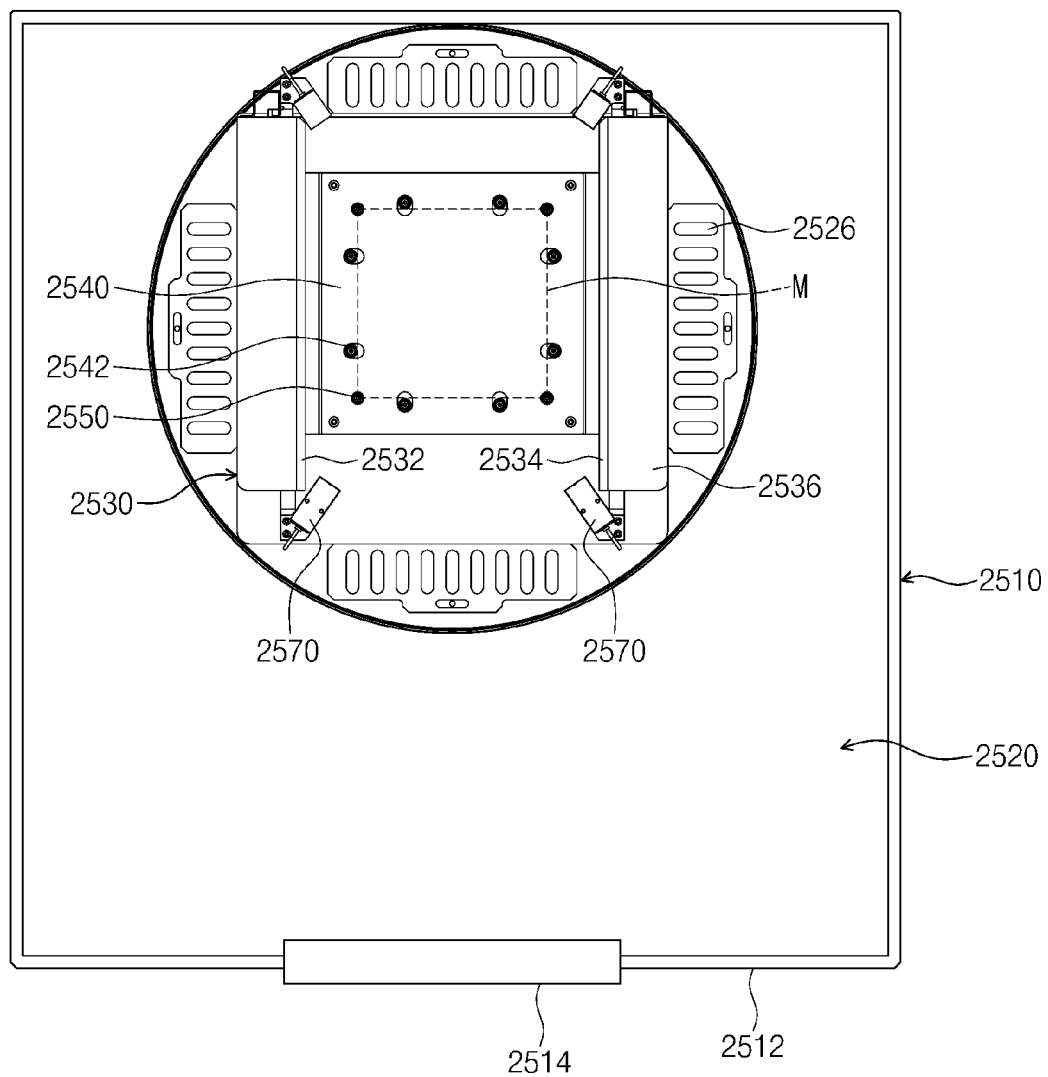
FIGS. 17 and 18 are plan and side-sectional views for explaining a photomask cooling device of FIG. 2, respectively.
Figure 18:
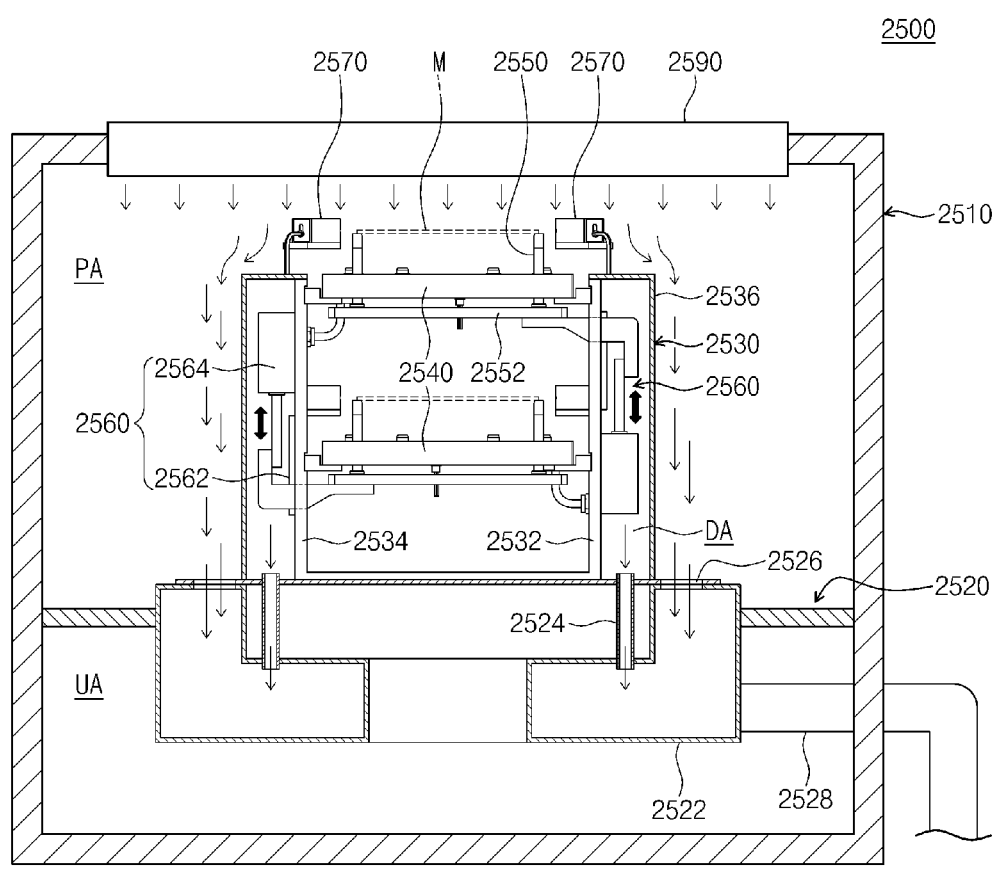

FIGS. 17 and 18 are plan and side-sectional views for explaining a photomask cooling device of FIG. 2, respectively.

Referring to FIGS. 17 and 18, the CPU 2500 includes a chamber 2510, a base plate 2520, and a cooling module 2530.

The chamber 2510 provides a sealed inner space. A fan filter unit 2590 is disposed at an upper portion of the chamber 2510. The fan filter unit 2590 generates a vertical air current in the chamber 2510. The chamber 2510 has a substrate entrance hole 2514 in a first surface 2512 adjacent to the first transfer passage 2100. Although not shown, a surface facing the first surface in which the substrate entrance hole 2514 is defined may be defined as an open surface opened for repairing. The open surface is sealed by a cover.

Filters including a chemical filter and an air supply fan may be modularized as one unit to constitute the fan filter unit 2590. The fan filter unit 2590 may be a unit for filtering air to supply the filtered air into the chamber 2510. The air passes through the fan filter unit 2590 and is supplied into the chamber 2510 to generate a vertical air current.

The chamber 2510 is partitioned into a processing area PA and a utility area VA by the base plate 2520. The cooling module 2530 is disposed on a top surface of the base plate 2520. An intake duct 2522 and an intake tube 2524 are disposed in a bottom surface of the base plate 2520. The intake duct 2522 is connected to an external exhaust line 2528. The intake tube 2524 connects the intake duct 2522 to the driving part space DA of the cooling module 2530 to provide a negative pressure to the driving part space DA. Particles generated in the driving part space DA are exhausted into the intake duct 2522 through the intake tube 2524.

The base plate 2520 has intake holes 2526 around a position at which the cooling module 2430 is disposed. The intake holes 2526 are connected to the intake duct 2522. Thus, the CPU 2500 may provide a uniform air current around the cooling module 2530.

Air within the chamber 2510 is introduced into the intake holes 2526 defined in the base plate 2520 and exhausted into the exhaust line 2528 through the intake duct 2522. Air within the driving part space DA of the cooling module 2530 is introduced into the intake tube 2524 and exhausted into the exhaust line 2528 through the intake duct 2522. Thus, high clean air may be always provided around the cooling module 2530.

Although shown in only a portion of the drawings, a cooling plate 2540 of the cooling module 2530, a cooling water supply line connected to a driving part 2560, a pneumatic tube, and a cable in addition to the exhaust tube 2524 connected to the driving part space DA of the cooling module 2530 may be disposed in the utility area VA. Also, the processing area PA may be isolated from the utility area VA to maintain the high clean air around the cooling module 2530.

The cooling module 2530 includes a first support frame 2532, a second support frame 2534, a cooling plate 2540, lift pins 2550, a driving part 2560, and a space-partitioning cover 2536. Photomask detection sensors 2570 for detecting whether the photomask M placed on the cooling plate 2540 is normally seated may be disposed on the cooling module 2530 in a diagonal direction.

The first support frame 2532 and the second support frame 2534 may be spaced from each other so that the cooling plate 2540 on which the photomask M is placed is disposed thereon. The cooling plate 2540 is disposed between the first support frame 2532 and the second support frame 2534. The cooling plate 2540 has a top surface on which the photomask M is placed and a cooling water passage (not shown) through which cooling water passes therein. The cooling water may be supplied through the cooling water supply line 2548 connected to a side of the bottom surface of the cooling plate 2540. Guide pins 2542 for guiding a loading position of the photomask M are disposed on the top surface of the cooling plate 2540. Although not shown, the cooling plate 2540 may include a sensor for detecting an internal temperature thereof.

The lift pins 2550 are disposed under the cooling plate 2540. The lift pins 2550 are disposed on a pin support 2552. The pin support 2552 is vertically movably disposed on the first and second support frames 2532 and 2543. The pin support 2552 may ascend or descend by the driving part 2560 disposed on an outer surface of the first support frame 2532. The driving part 2560 is a linear driving device including a guide rail 2562 and a cylinder 2564. The driving part 2560 is disposed within the driving part space DA defined by the space-partitioning cover 2536.

The space-partitioning cover 2536 is disposed to cover outer surfaces of the first and second support frames 2532 and 2543. The driving part 2560 is disposed in a space which is separated from the inner space of the chamber 2510 by the space-partitioning cover 2536.

Figure 19:
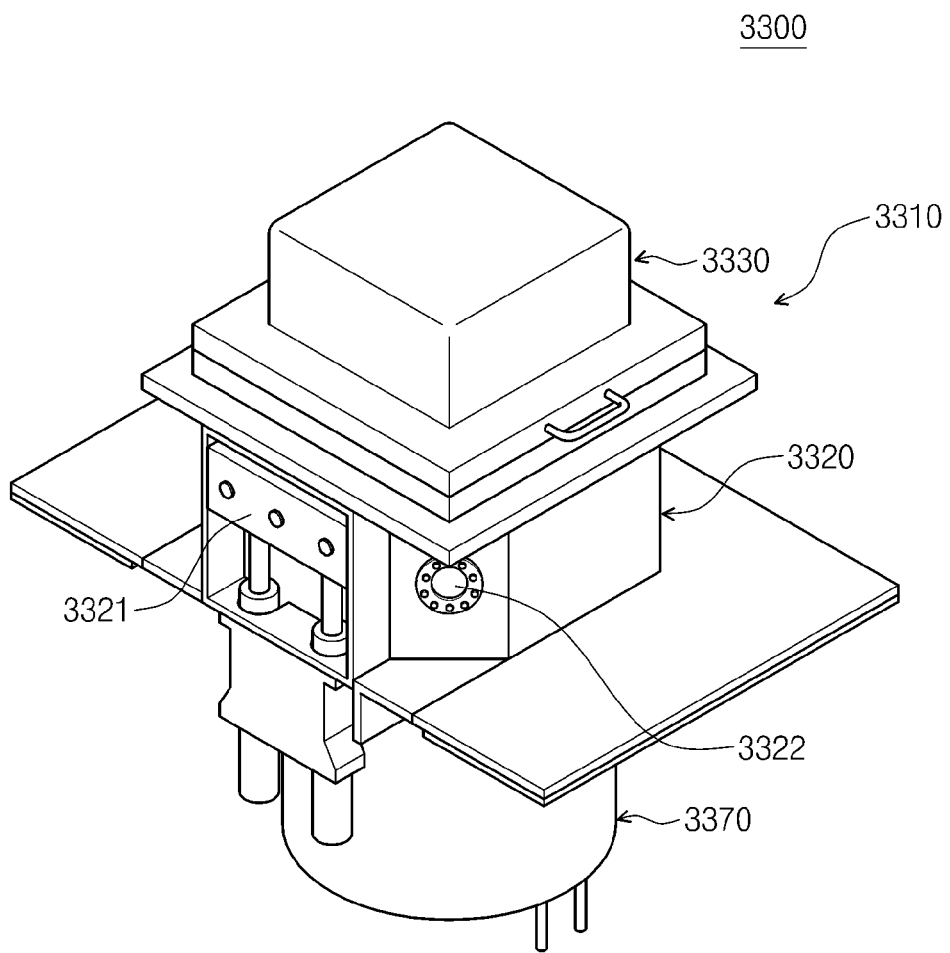
FIG. 19 is a schematic perspective view illustrating a heat processing module of FIG. 2.
Figure 20:
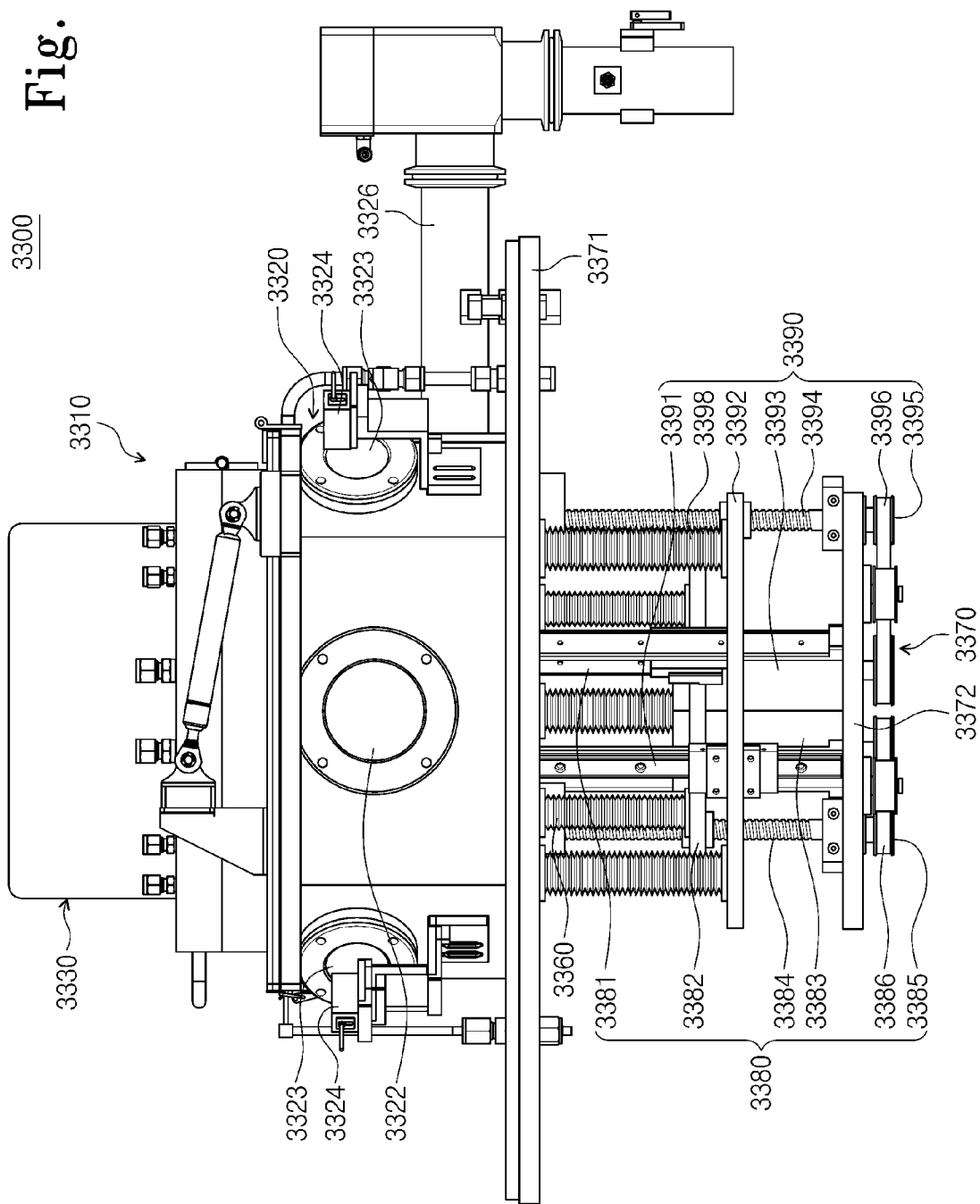
FIG. 20 is a rear view of the heat processing module.
Figure 21:
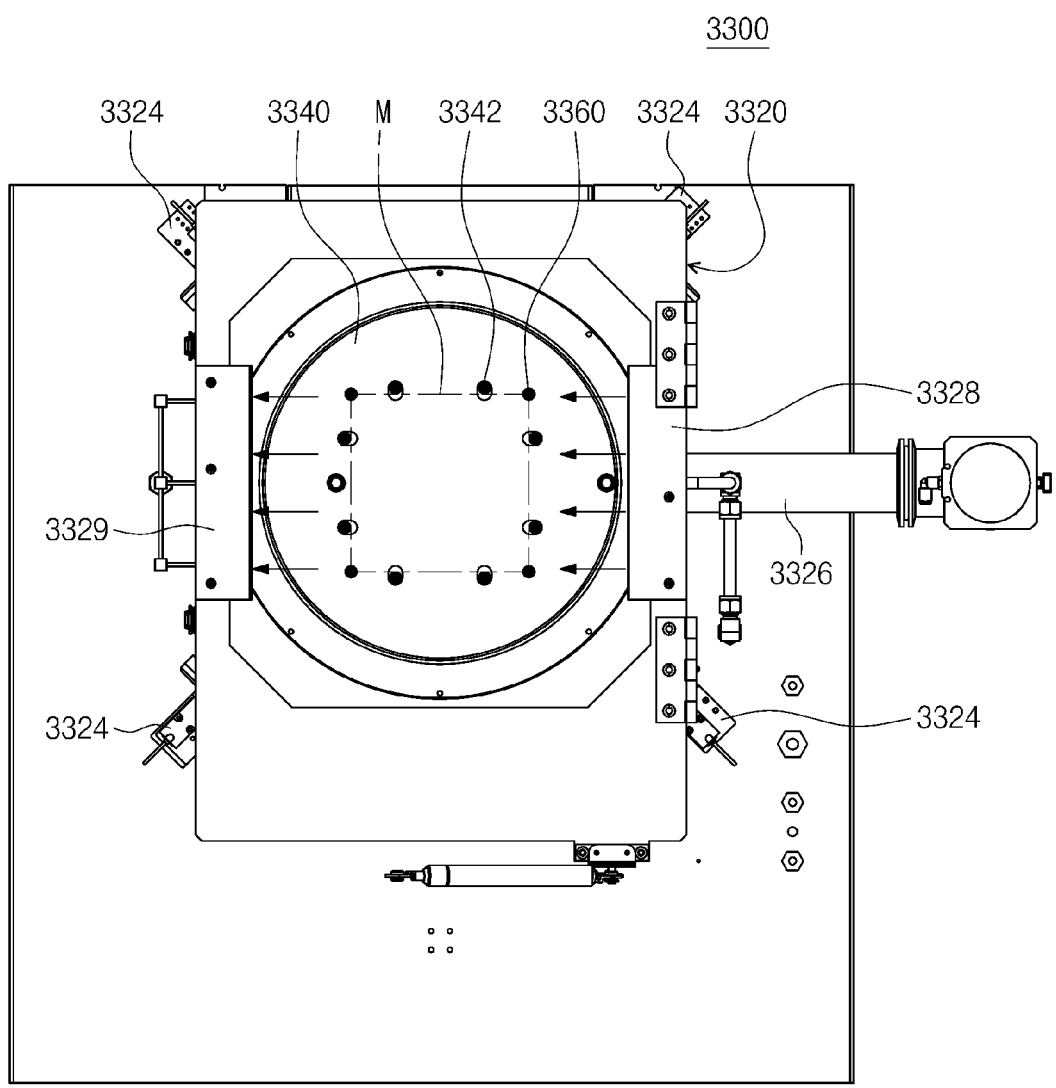
FIG. 21 is a plan view illustrating a main body of FIG. 19.
Figure 22:
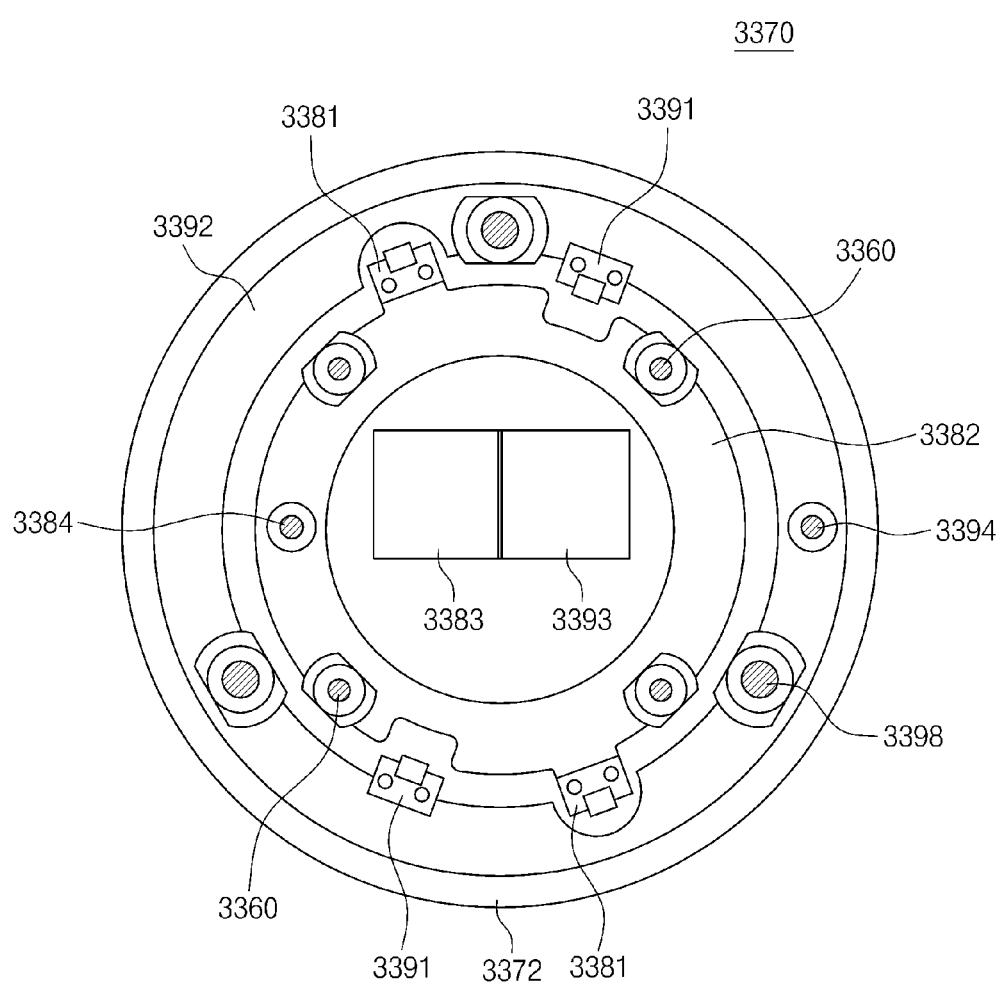
FIG. 22 is a sectional view of a height adjustment part.

FIG. 19 is a schematic perspective view illustrating the heat processing module of FIG. 2, and FIG. 20 is a rear view of the heat processing module. FIG. 21 is a plan view of a main body. FIG. 22 is a sectional view of a height adjustment part. FIGS. 23 to 26 are views illustrating various variations in a height of the photomask in the heat processing module. A structure of a chamber is simply illustrated in FIG. 19 for convenience of description.

Referring to FIGS. 19 to 26, the heat processing module 3300 includes a chamber 3310, a bake plate 3340, UV lamps 3350, lift pins 3360, and a height adjustment part 3370.

The chamber 3310 includes a main body 3320 and a cover 3330. The main body 3320 has an opened top surface and a front surface in which an entrance hole 3321 for taking a photomask in/out is defined. A view port (see FIG. 20) 3322 for allowing a worker to view the inside of the main body 3320 and a sensing port 3323 for detecting the photomask are disposed in side surfaces of the main body 3320. The sensing ports 3322 are disposed in a diagonal direction. Light receiving/emitting sensors 3324 are disposed outside the sensing port 3322 to detect whether the photomask exists and is misaligned in position. A main exhaust hole 3326 for discharging $O_3$ gas within the inner space of the chamber 3310 is defined in a rear surface of the main body 3320.

The main body 3320 includes a gas injection part 3328 for supplying process gas between the photomask disposed at an UV irradiation position (a photomask position shown in FIG. 24) and the UV lamps 3350 and a gas exhaust part 3329 for exhausting the process gas on a side surface facing the gas injection part 3328. The process gas may include one of air, nitrogen, oxygen, and argon. An arrow shown in FIG. 21 represents a flow of the process gas.

The cover 3330 is hinge-coupled to the main body 3320 to open or close the opened top surface of the main body 3320. The cover 3330 has a lamp installation space 3331 in which the UV lamps 3350 are disposed. The lamp installation space 3331 is separated from the inside of the chamber 3310 by a quartz window 3332. Although not shown, the cover 3330 has a cooling water line to block heat of the UV lamps. For example, the UV lamps 3350 are constituted by four 172 nm Excimer lamps.

The bake plate 3340 is disposed adjacent to a bottom of the main body 3320. The bake plate 3340 includes eight support protrusions 3342, on which the photomask M is seated, on a top surface thereof. For example, the bake plate 3340 may be increased in temperature up to about 300° C. Also, the bake plate 3340 has five heating zone to provide a uniform temperature thereto. The bake plate 3340 is adjustably disposed in height within the chamber 3310. The bake plate 3340 has through-holes in which the lift pins 3360 are disposed.

The lift pins 3360 include four pins for supporting four edges of the photomask M. The lift pins 3360 passes through the bottom of the chamber 3310 and are connected to the height adjustment part 3370.

The height adjustment part 3370 is disposed under the chamber 3310. The height adjustment part 3370 is a driving device for adjusting heights of the lift pins 3360 and the bake plate 3340 to change a position of the photomask M.

The height adjustment part 3370 includes an upper plate 3371, a lower plate 3372, a first elevation driving part 3380 for elevating the lift pins 3360, and a second elevation driving part 3390 for elevating the bake plate 3340. The upper plate 3371 is fixed to the chamber 3310. The lower plate 3372 is sufficiently spaced from the upper plate 3371.

The first elevation driving part 3380 includes a pair of first ML guides 3381, a first movement ring 3382, a first driving motor 3383, a first ball screw 3384, a belt 3385, and a pulley 3386.

The pair of first LM guides 3381 is vertically disposed with respect to the upper and lower plates 3371 and 3372. The first movement ring 3382 is disposed to ascend/descend along the pair of first LM guides 3381. Lower ends of the lift pins 3360 are fixed to the first movement ring 3382. The first ball screw 3384 is connected to the first movement ring 3382. The first driving motor 3383 rotates the first ball screw 3384. A power of the first driving motor 3383 is transmitted into the first ball screw 3384 through the belt 3385 and the pulley 3386. The first movement ring 3382 may ascend or descend along the first LM guides 3381 by the rotation of the first ball screw 3384. The lift pins 3360 are surrounded by a metal bellows to provide space sealing when the lift pins 3360 are vertically moved.

The first elevation driving part 3380 may adjust a height of each of the lift pins 3360 in three stages.

Figure 23:
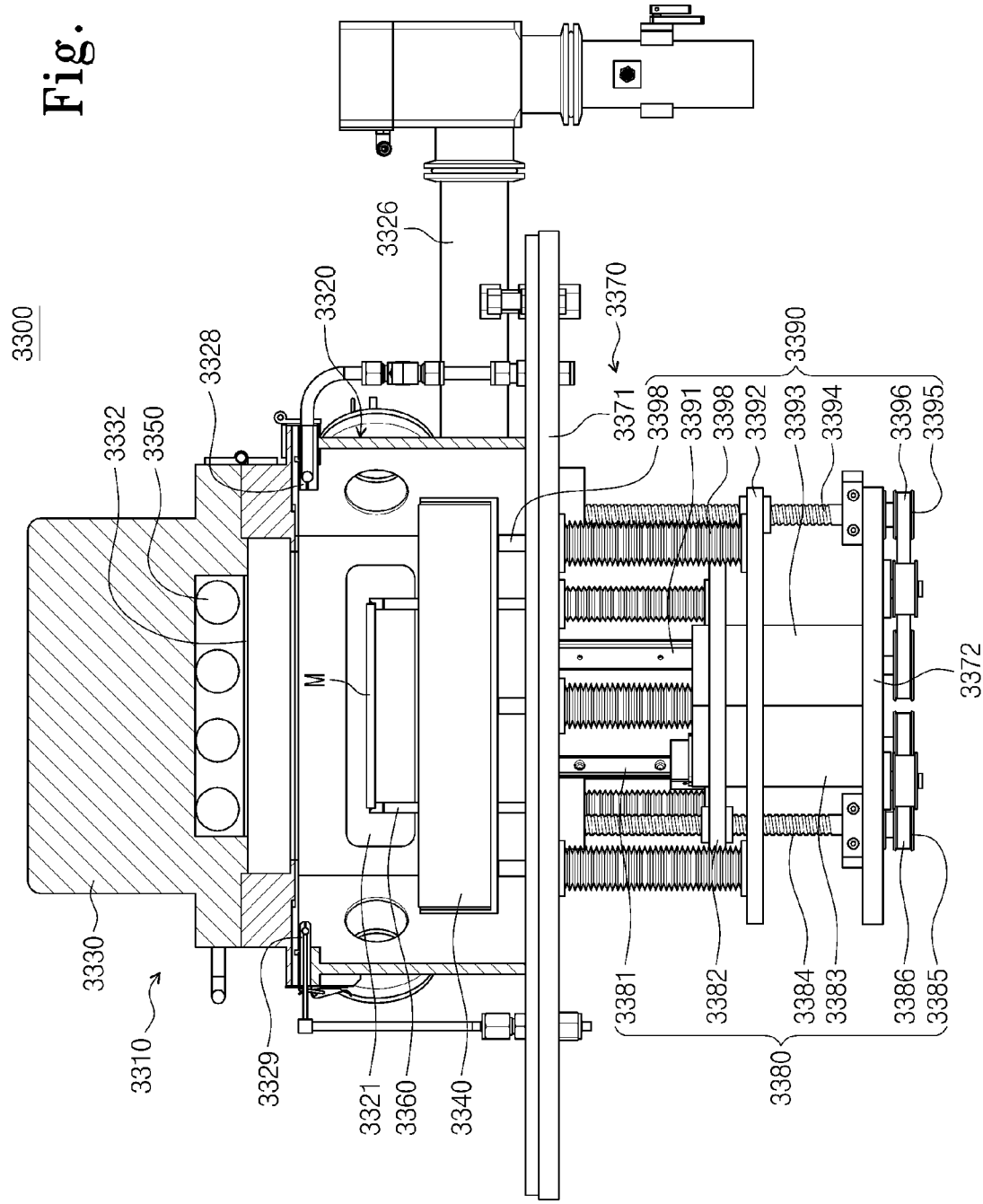
FIGS. 23 to 26 are views illustrating various variations in a height of the photomask in the heat processing module.
Figure 24:
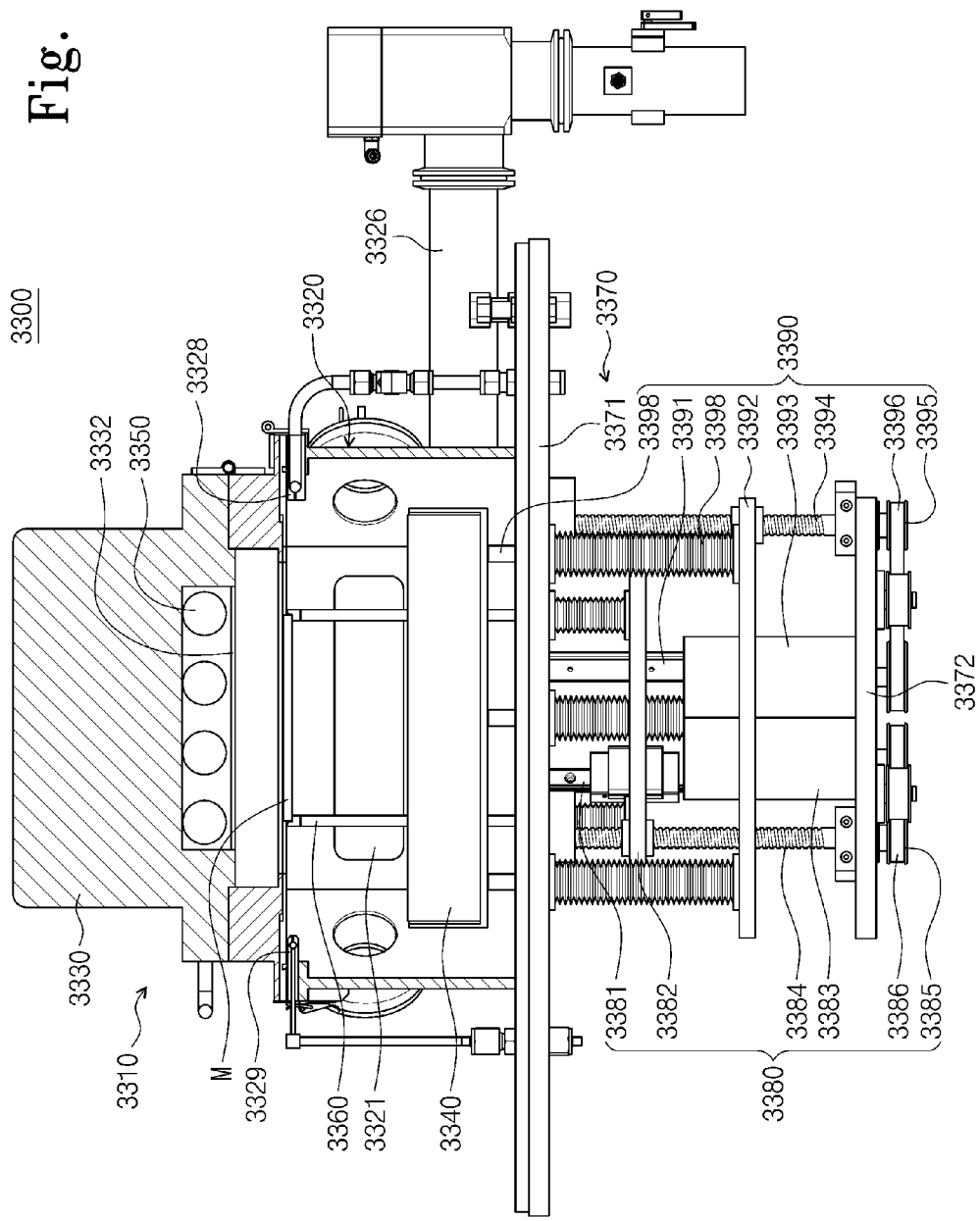
Figure 25:
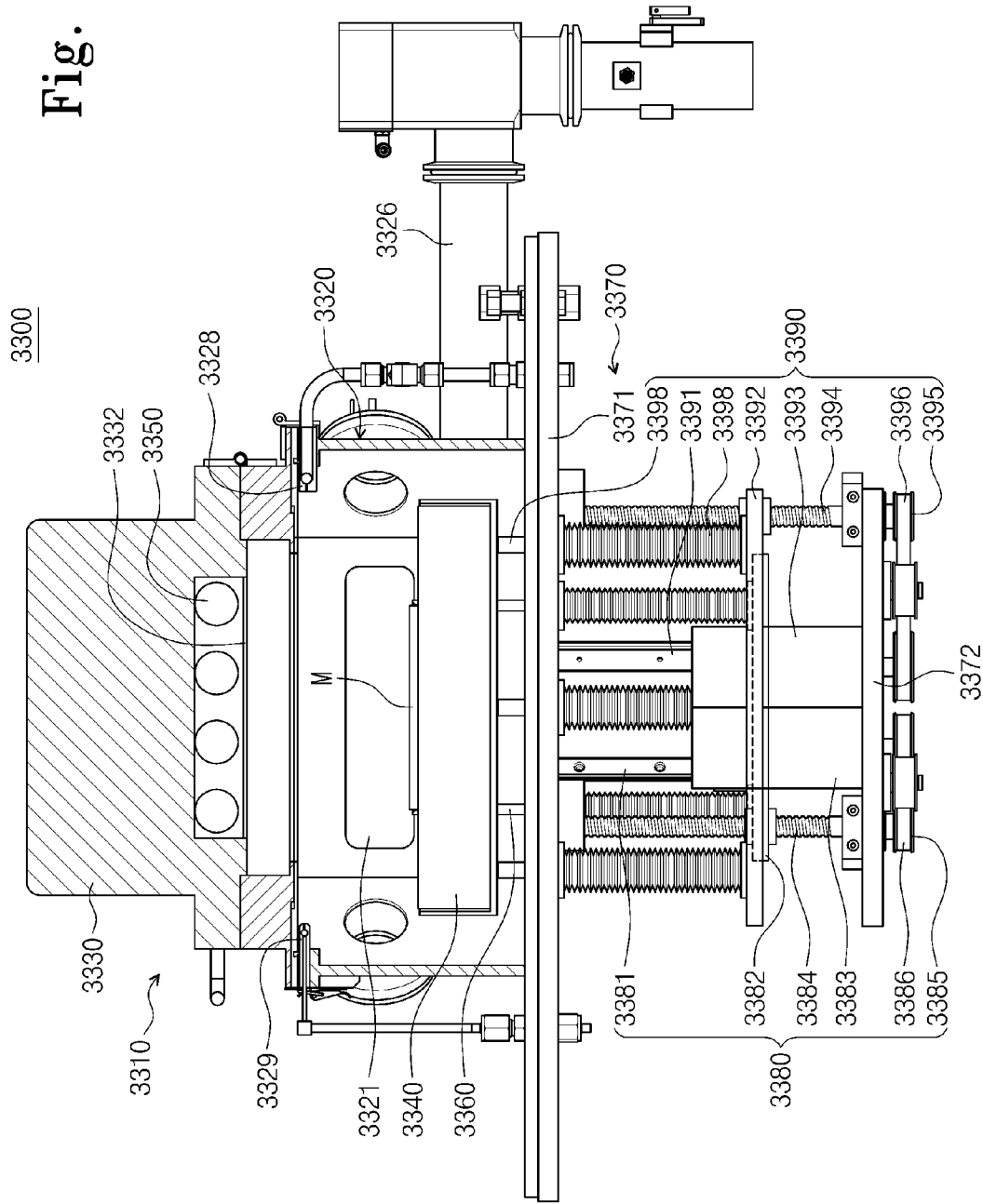

A first stage height is a bake processing height at which the photomask M is seated on the bake plate 3340. FIG. 25 illustrates a state in which the photomask M is disposed at the bake processing height in a state where the photomask M is seated on the bake plate 3340. A second stage height is a loading/unloading height at which the photomask M is taken in or out through the entrance hole 3321. FIG. 23 illustrates a state in which the photomask M is disposed at the loading/unloading height in a state where the photomask M is seated on the lift pins 3360. A third stage height is an UV irradiation height at which the photomask M to be processed using UV rays approaches the UV lamps 3350. FIG. 24 illustrates a state in which the photomask M is disposed at the UV irradiation height in a state where the photomask M is seated on the lift pins 3360.

The second elevation driving part 3390 includes a pair of second ML guides 3391, a second movement ring 3392, a second driving motor 3393, a second ball screw 3394, a belt 3395, a pulley 3396, and bake support pins 3398.

The pair of second LM guide 3391 is vertically disposed with respect to the upper and lower plates 3371 and 3372. The second movement ring 3392 may disposed to ascend or descend along the pair of second LM guides 3391. Lower ends of the bake support pins 3398 are fixed to the second movement ring 3392. The bake support pins 3398 support the bake plate 3340 through the chamber 3310. The second ball screw 3394 is connected to the second movement ring 3392. The second driving motor 3393 rotates the second ball screw 3394. A power of the second driving motor 3393 is transmitted into the second ball screw 3394 through the belt 3395 and the pulley 3396. The second movement ring 3392 may ascend or descend along the second LM guides 3391 by the rotation of the second ball screw 3394. The bake support pins 3398 are surrounded by a metal bellows to provide space sealing when the bake support pins 3398 are vertically moved.

The second elevation driving part 3390 may adjust a height of the bake plate 3340 in two stages.

Figure 26:
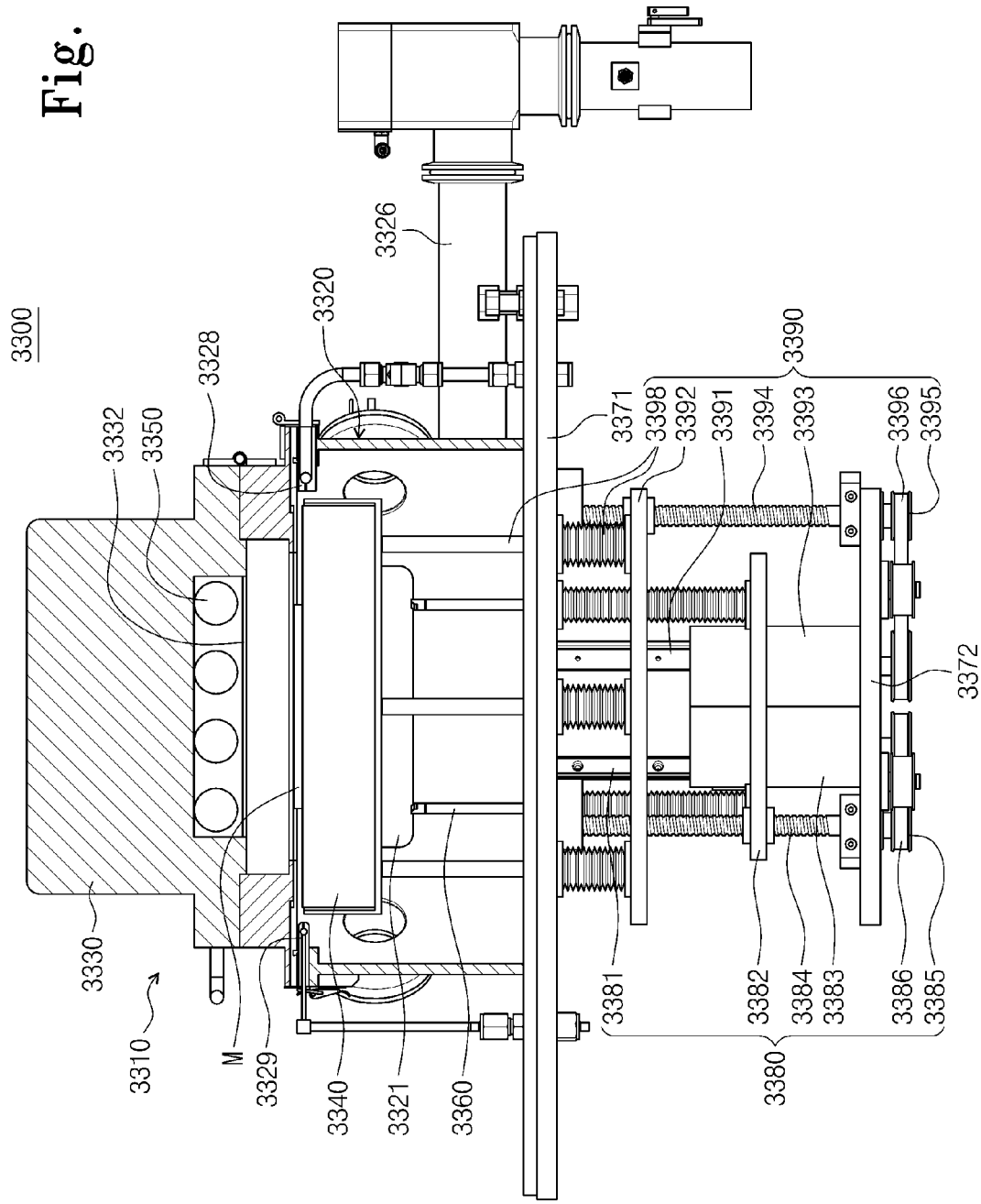

A first stage height is a bake processing height at which the photomask M is seated on the bake plate 3340. FIG. 10 illustrates a state in which the photomask M is disposed at the bake processing height in a state where the photomask M is seated on the bake plate 3340. A second stage height is an UV irradiation height at which the photomask M approaches the UV lamps 3350 in a state where the photomask M is seated on the bake plate 3340. FIG. 26 illustrates a state in which the photomask M is disposed at the UV irradiation height in a state where the photomask M is seated on the bake plate 3340.

As described above, the second elevation driving part 3390 vertically elevates the bake plate 3340 in the two stages so that the photomask M is baked by the bake plate 3340 and irradiated by the UV lamps 3350 at the same time. The UV irradiation height, i.e., a distance between the a top surface of the photomask M and each of the UV lamps 3350 may be about 1 mm to about 3 mm.

As described above, in the heat processing module 3300 according to the present invention, the baking process and the UV irradiation process may be separately performed or simultaneously performed by combining the baking process and the UV irradiation process with each other.

A first transfer device (i.e., the first transfer robot in FIG. 2) and a second transfer device (i.e., the second transfer robot in FIG. 3) have the same constitution. Thus, in this embodiment, only the first transfer device 220 will be described in detail.

Figure 27:
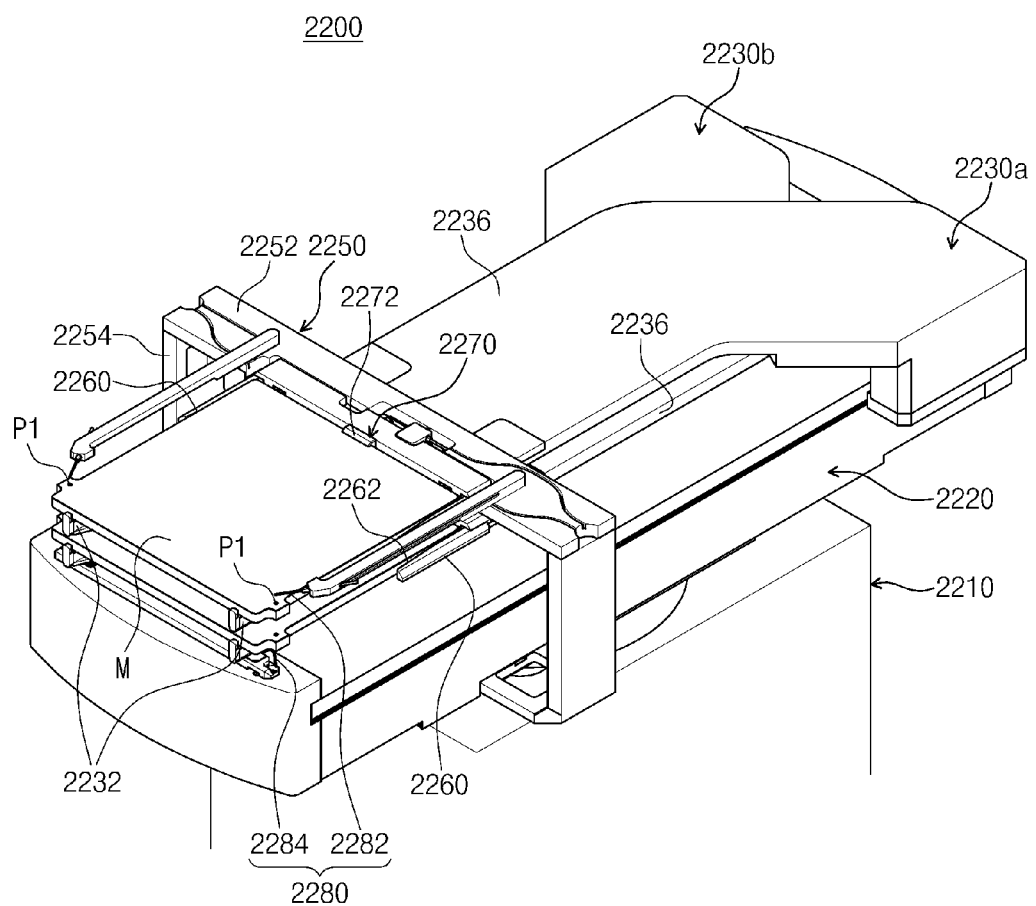
FIG. 27 is a perspective view illustrating a first transfer device of FIG. 2.
Figure 28:
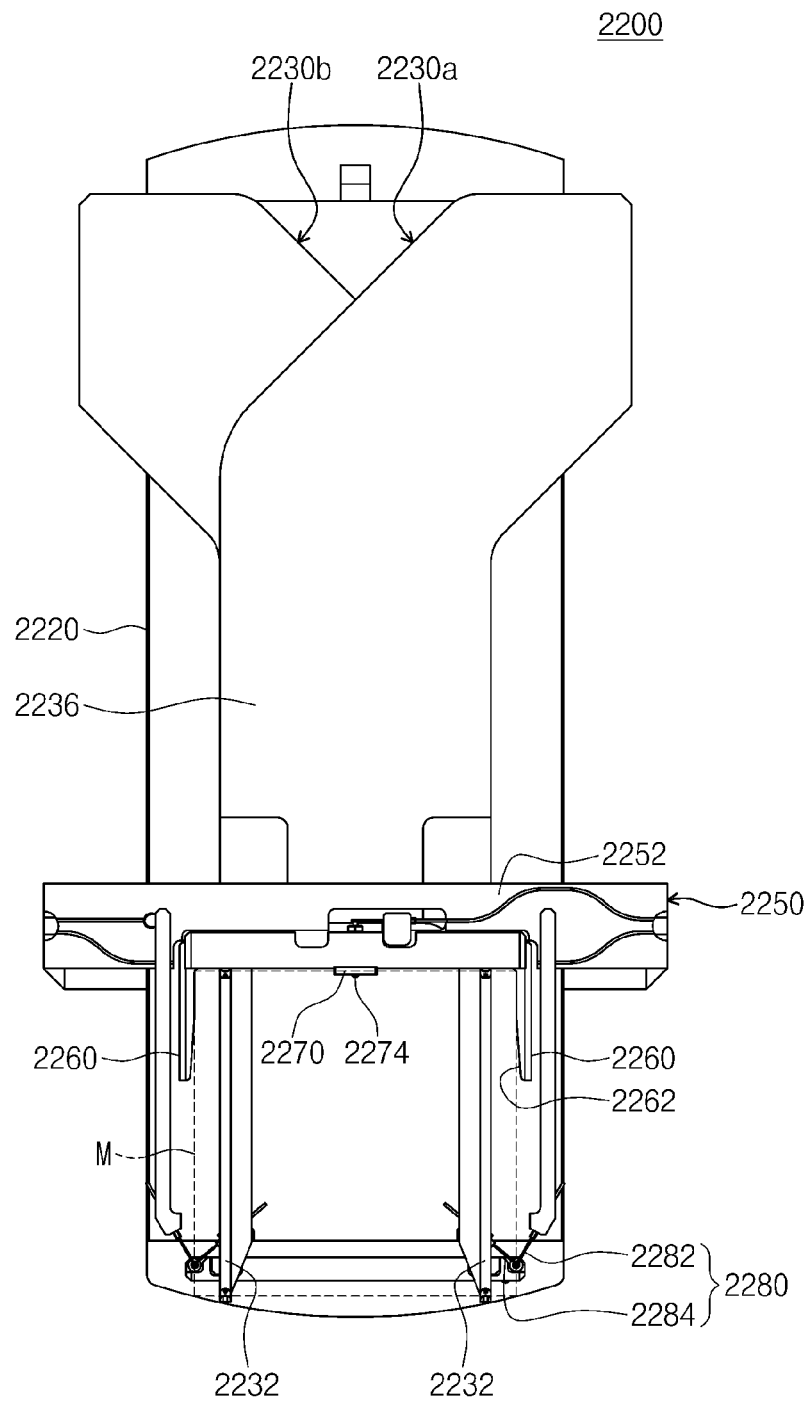
FIGS. 28 and 29 are plan views of the first transfer devices.
Figure 29:
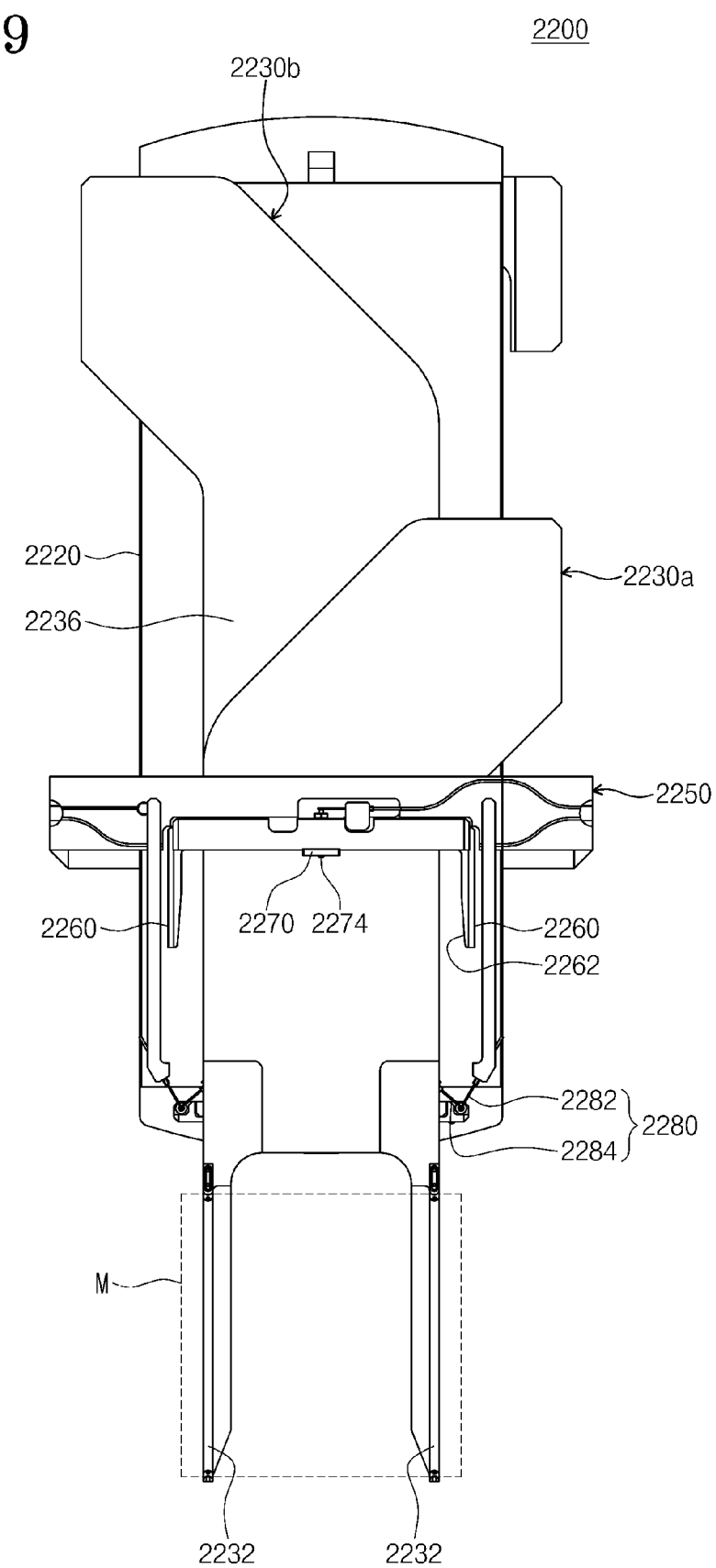
Figure 30:
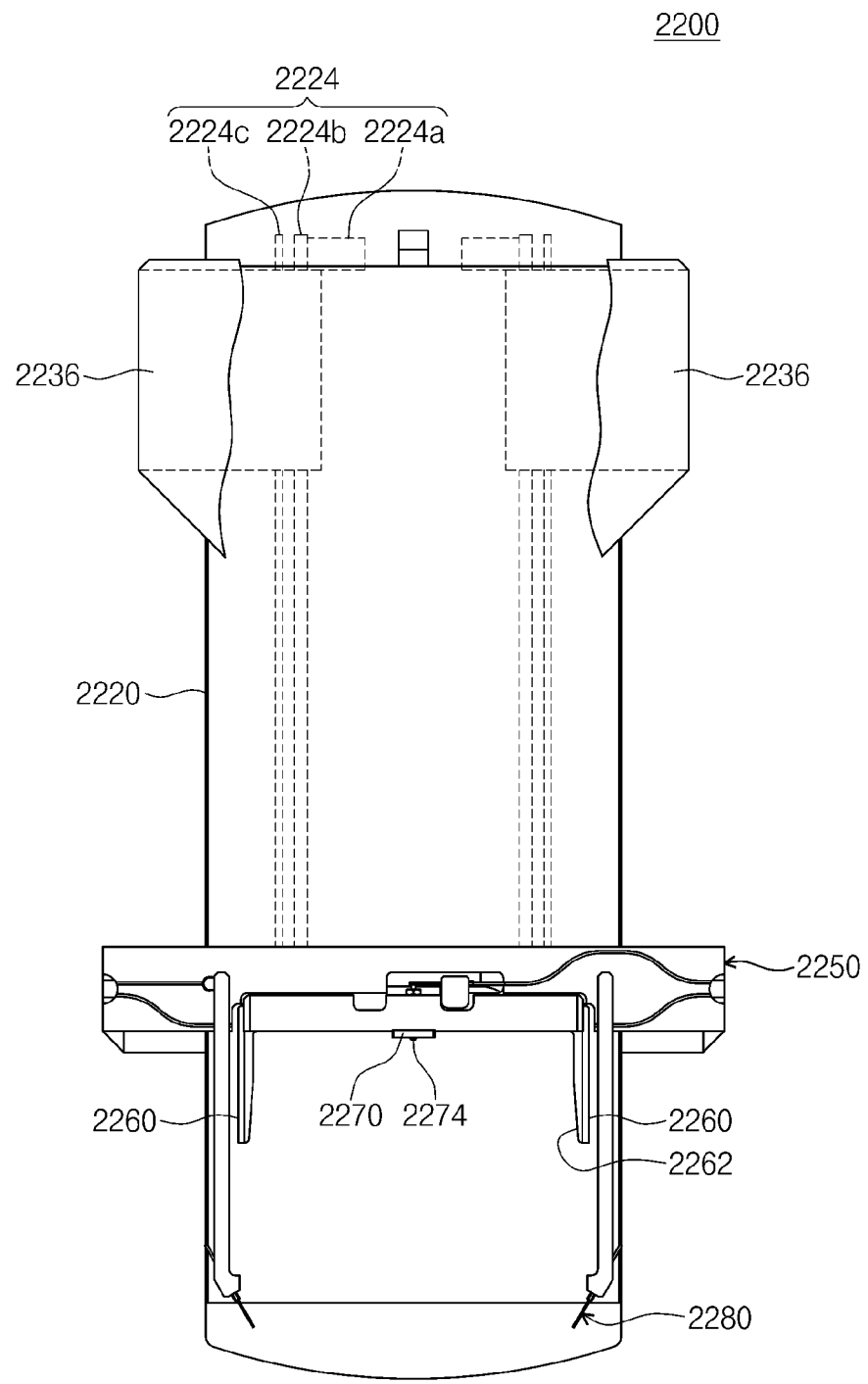
FIG. 30 is a view for explaining a driving part installed on a base of the first transfer device.
Figure 31:
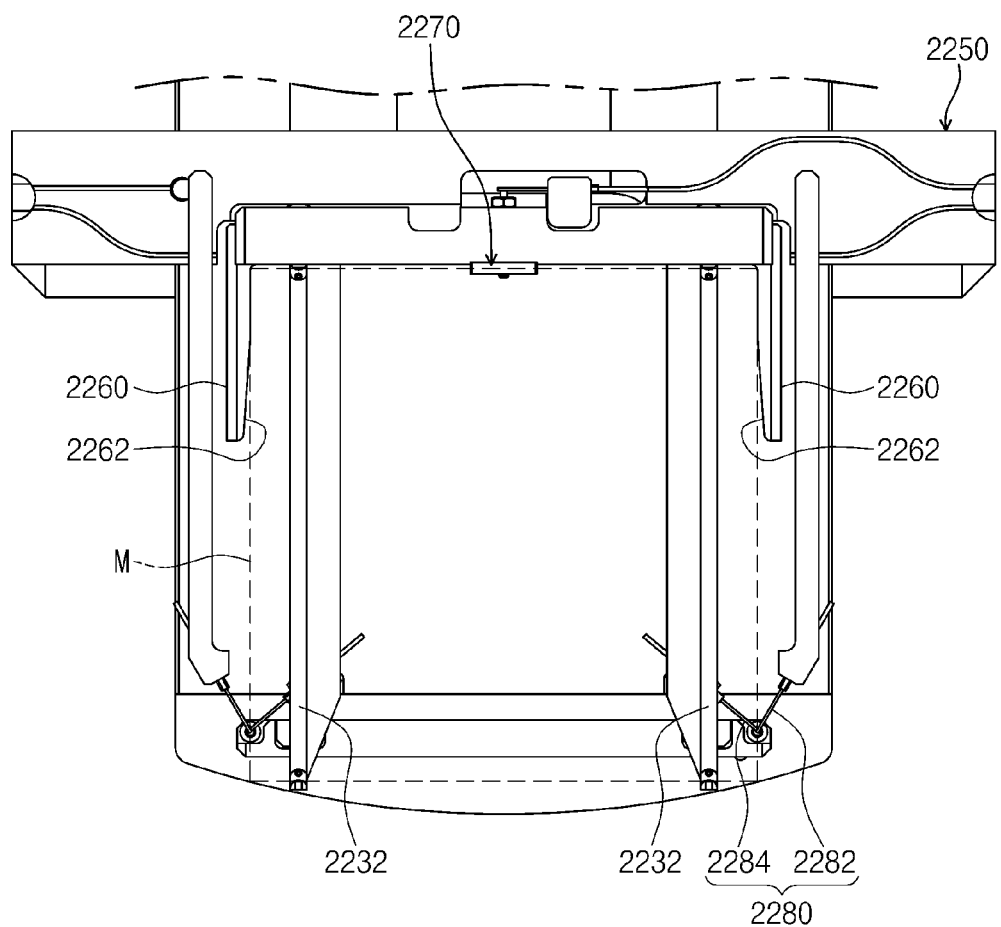
FIG. 31 is an enlarged view illustrating a main part of the first transfer device.
Figure 32:
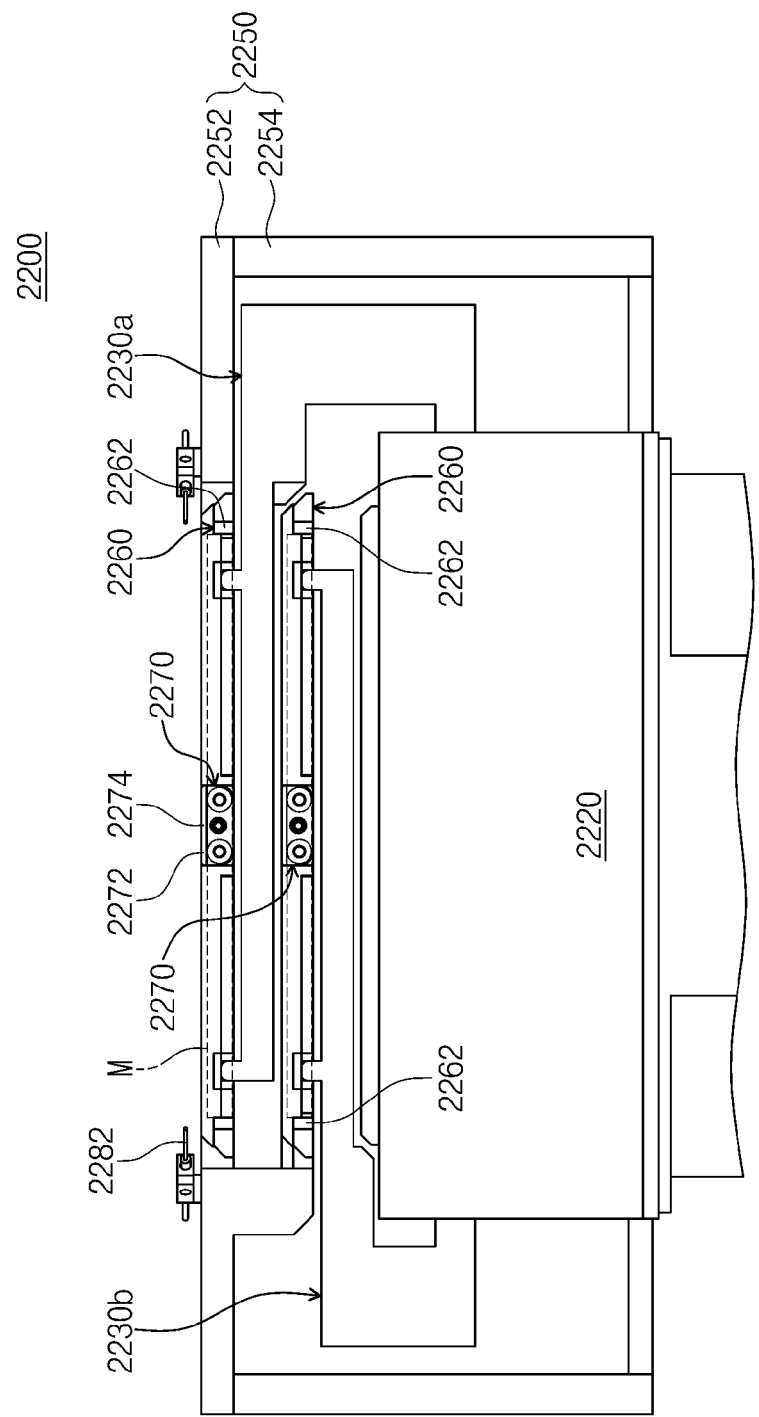
FIG. 32 is a front view of the first transfer device.

FIG. 27 is a perspective view illustrating a first transfer device of FIG. 2, and FIGS. 28 and 29 are plan views of the first transfer devices. FIG. 30 is a view for explaining a driving part installed on a base of the first transfer device. FIG. 31 is an enlarged view illustrating a main part of the first transfer device. FIG. 32 is a front view of the first transfer device.

Referring to FIGS. 27 to 32, the first transfer device 2200 includes a main body 2210, a base 2220 disposed on the main body 2210, first and second hands 2230a and 2230b movable in front and rear direction on the base 2220, a gantry 2250 disposed on the base 2220, a pair of alignment guides 2260 disposed on the gantry to align the photomask, a grip part 2270 disposed on the gantry 2250, and a misalignment detection part 2280 disposed on the gantry to detect misalignment of the photomask.

For example, the base 2220 may be rotatable and adjustable in height on the main body 2210. The first transfer device 2200 according to the present invention includes two hands to replace the photomask M. For example, one of the two hands may transfer a photomask in which the process processing is completed into the processing module, and the other one of the two hands may transfer a photomask in which the process processing is not performed into the processing module.

The first and second hands 2230a and 2230b may be independently movable in front and rear directions at height different from each other. In this embodiment, the first hand 2230a is disposed above the second hand 2230b. Each of the first and second hands 2230a and 2230b includes a pocket part 2232 on which the photomask M is placed and a connection arm 2236 extending from a side of the pocket part 2232 and connected to driving parts 2224 disposed within the base 2220. The pocket part 2232 may have various shapes.

In the first transfer device 2200, the photomask M is picked up in a state where the first or second hand 2230a or 2230b is moved in the front direction and is transferred in a state where the first or second hand 2230a or 2230b is moved in the rear direction (a home position). Referring to FIG. 29, it may be seen that the first hand 2230a is moved to the pick-up position, and the second hand 2230b is moved to the home position.

Referring to FIG. 30, the first and second hands 2230a and 2230b may be moved by the two driving parts 2224 disposed within the base 2220. Each of the driving parts 2224 may include a motor 2224a, a belt pulley 2224b for transmitting a power of the motor 2224a into the first hand 2230a (or the second hand 2230b), and a guide rail 2224c for guiding the front and rear movement of the first hand 2230a (or the second hand 2230b). For convenience of description, the foregoing parts will be simply illustrated in FIG. 30. Other linear driving devices such as a cylinder may be used as the driving part 2224.

The gantry 2250 includes a horizontal beam 2252 spaced from a top surface of the base 2220 and a support 2254 supporting both ends of the horizontal beam 2252 and fixed to both sides of the base 2252.

The pair of alignment guides 2260 is disposed on the horizontal beam 2252 of the gantry 2250. The pair of alignment guides 2260 is disposed at the same height as that of the photomask M placed on the first and second hands 2230a and 2230b. The pair of alignment guides 2260 is spaced from each other and guides both side surfaces of the photomask M. Each of the pair of alignment guides 2260 has an inclined surface 2262 inclined outward so that the alignment guide 2260 has a width gradually increased toward a front end thereof. Thus, event though the photomask M is misaligned, the photomask M may be easily inserted between the pair of alignment guides 2260.

Thus, when the photomask M is moved from the pick-up position to the home position, it may prevent the photomask M from being misaligned due to the pair of alignment guides 2260. That is, event though the photomask M is placed on the first hand 2230a (or the second hand 2230b) in the misaligned state at the pick-up position, the photomask M may be aligned by the pair of alignment guides 2260 when the photomask M is moved to the home position.

The grip part 2270 is disposed on a front surface of the horizontal beam 2252. The grip part 2270 includes a stopper 2272 on an upper end thereof. The stopper 2272 prevents the photomask M placed on the pocket part 2232 from being separated upward when the first hand 2230a or the second hand 2230b return from the pick-up position to the home position. Also, the grip part 2270 includes a sensor 2274 for detecting the presence or not of the photomask M. The sensor 2274 detects whether the photomask M is present or not by being pushed by the photomask M when the photomask M is moved to the home position after the photomask M is normally placed on the first hand 2230a (or the second hand 2230b).

The misalignment detection part 2280 is disposed on the gantry 2250. The misalignment detection part 2280 detects the misalignment of the photomask M at the home position. The misalignment detection part 2280 detects the photomask M in a vertical direction. The misalignment detection part 2280 may be disposed between the light emitting part 2282 and the light receiving part 2284. Also, the misalignment detection part 2280 may be disposed so that the photomask M passes through sensing holes P1 defined in both sides of a front end thereof. If the photomask M is mounted on the pocket part 2232 or disposed angled toward one side, the light receiving part 2284 of the misalignment detection part 2280 does not receive a signal from the light emitting part 2282. In this case, it may be determined that the photomask M is misaligned in position. As a result, an alarm goes off to stop the processing process.

According to the present invention, the dry cleaning and the wet cleaning may be performed in one apparatus to reduce the process processing time and prevent the back contamination of the photomask from occurring due to the reduced external exposure of the photomask.

Also, the dry and wet cleaning may be selectively performed.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing apparatus comprising:
   an index part including,
      a port on which a container containing a substrate is placed, and
      an index robot;
   a processing part configured to process the substrate; and
   a buffer unit between the processing part and the index part, the buffer unit is configured to allow the substrate transferred between the processing part and the index part to be temporarily stayed therein,
   wherein the processing part includes a glue removal processing module, a substrate cooling processing module, a heat processing module, and a functional water processing module along a transfer passage for transferring the substrate,
   wherein the glue removal processing module includes,
      a high temp sulfuric unit (HSU) configured to apply a sulfuric peroxide mixture (SPM) solution to an entire surface of the substrate to remove glue, and
      a glue removal high temp sulfuric unit (GSU) configured to partially apply the SPM solution to edges of the substrate to remove glue.

2. The substrate processing apparatus of claim 1, wherein the processing part comprises:
   a first processing part in which a wet cleaning process is performed on the substrate; and
   a second processing part stacked on the first processing part, the second processing part configured to perform dry and functional water cleaning processes on the substrate.

3. The substrate processing apparatus of claim 2, wherein the first processing part comprises a first transfer passage, the first transfer passage including a first transfer robot for transferring the substrate, and
   the glue removal processing module and the substrate cooling processing module are disposed along the first transfer passage on a side of the first transfer passage.

4. The substrate processing apparatus of claim 3, wherein the second processing part comprises a second transfer passage, the second transfer passage including a second transfer robot for transferring the substrate, and
   the heat processing module and the functional water processing module are disposed on the second transfer passage on a side of the second transfer passage.

5. The substrate processing apparatus of claim 4, wherein the heat processing module comprises:
   a bake plate configured to perform a baking process; and
   an UV lamp configured to perform an UV irradiation process,
   wherein the baking process and the UV irradiation process are separately performed or simultaneously performed.

6. The substrate processing apparatus of claim 4, wherein the functional water processing module selectively uses functional water to remove particles, and
   the functional water comprises deionized water containing $CO_2$, deionized water containing $H_2$, and deionized water containing $O_3$.

7. The substrate processing apparatus of claim 4, wherein each of the first and second transfer robots comprises:
   a base;
   at least one hand comprising a pocket part, the at least one hand being moved from a home position defined above the base to a pick-up position at which the substrate is picked up;
   an alignment part for aligning the substrate in position when the at least one hand returns from the pick-up position to the home position; and
   a gantry spaced from a top surface of the base and on which the alignment part is disposed.

8. The substrate processing apparatus of claim 1, wherein an ionizer is in the transfer passage.

9. The substrate processing apparatus of claim 1, wherein the buffer unit comprises:
   a first buffer on which the substrate is placed;
   a driving part configured to reverse the first buffer; and
   a frame having a central area including opened front and rear surfaces and a driving part area on both sides of the central area, the central area on which the first bliffer is disposed, and the driving part area on which the driving part is disposed.

10. The substrate processing apparatus of claim 9, wherein the first buffer comprises:
    a first support part configured to one surface of the substrate; and a second support part facing the first support part, the second support part configured to support the other surface of the substrate placed on the first support part, wherein the driving part comprises:

a rotation module configured to rotate the first and second support parts; and an elevation module configured to elevate the second support part so that the substrate is gripped on the first and second support parts.

11. The substrate processing apparatus of claim 10, wherein a rotation axis of the first buffer is eccentric from a center of the gripped position of the substrate so that a loading position of the substrate is the same as an unloading position of the substrate after the substrate is reversed.

12. The substrate processing apparatus of claim 1, wherein the heat processing module comprises:

a bake plate on which the substrate is loaded;

a main body on which the bake plate is disposed, the main body having an opened top surface and a side surface in which an entrance hole for taking the substrate in or out is defined;

a cover for opening or closing the opened top surface of the main body; and

UV lamps in the cover to irradiate UV rays onto the substrate.

13. The substrate processing apparatus of claim 12, further comprising:

lift pins configured to support the substrate taken in or out through the entrance hole;

a first elevation driving part configured to elevate the substrate supported by the lift pins between the bake plate and the UV lamps; and a second elevation driving part configured to elevate the bake plate, wherein the first elevation driving part is configured to elevate the substrate:

at a load/unloading position at which the substrate is taken in or out through the entrance hole;

at a bake position lower than the loading/unloading position and at which the substrate is seated on the bake plate to perform a baking process on the substrate; and at an UV irradiation position higher than the loading/unloading position and at which the substrate approaches the UV lamps to perform the UV irradiation process on the substrate, and wherein the second elevation driving part is configured to elevate the bake plate to the UV irradiation position approaching the UV lamps to perform the UV irradiation process on the substrate.

14. A substrate processing apparatus comprising:

an index part including, a port on which a container containing a substrate is placed, and an index robot a processing part for processing the substrate, the processing part including a glue removal processing module, a substrate cooling processing module, a heat processing module, and a functional water processing module along a transfer passage for transferring the substrate; and a buffer unit between the processing part and the index part to allow the substrate transferred between the processing part and the index part to be temporarily stayed therein, wherein the substrate cooling processing module includes, a chamber, and a cooling unit in an inner space of the chamber, the cooling unit including, first and second support frames spaced from each other;

a cooling plate inside the first and second support frames and on which the substrate is placed;

lift pins under the cooling plate; and a driving part outside the first and second support frames to lift the lift pins up and down.

15. The substrate processing apparatus of claim 14, wherein the cooling unit further comprising:

a space-partitioning cover covering outer surfaces of the first and second support frames so that a driving part space in which the driving part is disposed is partitioned from an inner space of the chamber.

* * * * *